United States Patent
Park et al.

(10) Patent No.: US 11,069,822 B2
(45) Date of Patent: Jul. 20, 2021

(54) TRANSITION METAL CHALCOGENIDE VAN DER WAALS FILMS, METHODS OF MAKING SAME, AND APPARATUSES AND DEVICES COMPRISING SAME

(71) Applicant: CORNELL UNIVERSITY, Ithaca, NY (US)

(72) Inventors: Jiwoong Park, Chicago, IL (US); Kibum Kang, Chicago, IL (US); Hui Gao, Brooklyn, NY (US); Saien Xie, Chicago, IL (US); Kan-Heng Lee, Chicago, IL (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 16/316,171

(22) PCT Filed: Jul. 10, 2017

(86) PCT No.: PCT/US2017/041351
§ 371 (c)(1),
(2) Date: Jan. 8, 2019

(87) PCT Pub. No.: WO2018/009931
PCT Pub. Date: Jan. 11, 2018

(65) Prior Publication Data
US 2020/0083037 A1  Mar. 12, 2020

Related U.S. Application Data

(60) Provisional application No. 62/360,053, filed on Jul. 8, 2016.

(51) Int. Cl.
*H01L 51/40* (2006.01)
*H01L 29/08* (2006.01)
(Continued)

(52) U.S. Cl.
CPC ........ *H01L 29/88* (2013.01); *H01L 21/02568* (2013.01)

(58) Field of Classification Search
CPC .................................................. H01L 21/02568
(Continued)

(56) References Cited

U.S. PATENT DOCUMENTS 5,351,164 A *  9/1994  Grigortchak ........... H01G 9/155
7,361,929 B2   4/2008  Bucher et al.
(Continued)

FOREIGN PATENT DOCUMENTS

CN  104310380 B  6/2016
CN  106298466 A  1/2017
(Continued)

OTHER PUBLICATIONS

Lin, Z., et al., Controllable Growth of Large-Size Crystalline $MoS_2$ and Resist-Free Transfer Assisted with a Cu Thin Film, Scientific Reports 5, 18596; Dec. 21, 2015, pp. 1-10.
(Continued)

*Primary Examiner* — Calvin Lee
(74) *Attorney, Agent, or Firm* — Johnson, Marcou, Issacs & Nix, LLC; Paul J. Roman, Jr.

(57) ABSTRACT

Provided are van der Waals (VDW) films comprising one or more transition metal chalcogenide (TMD) films. Also provided are methods of making VDW films. The methods are based on transfer of monolayer TMD films under vacuum, for example, using a handle layer. Also provided are apparatuses and devices comprising one or more VDW film.

20 Claims, 13 Drawing Sheets

(51) Int. Cl.
*H01L 29/88* (2006.01)
*H01L 21/02* (2006.01)

(58) Field of Classification Search
USPC .................................. 438/82, 99; 257/36, 40
See application file for complete search history.

(56) References Cited

U.S. PATENT DOCUMENTS

| | | | |
|---|---|---|---|
| 7,943,491 B2* | 5/2011 | Nuzzo | H01L 31/1892 |
| | | | 438/472 |
| 8,753,468 B2 | 6/2014 | Caldwell et al. | |
| 9,630,161 B2* | 4/2017 | Hohman | B22F 9/082 |
| 9,812,525 B2* | 11/2017 | Dresselhaus | H01L 29/45 |
| 10,319,825 B2* | 6/2019 | Terrones | H01L 21/768 |
| 10,465,276 B2* | 11/2019 | Robinson | C23C 16/042 |
| 10,593,819 B2* | 3/2020 | Yeom | H01L 31/18 |
| 10,727,004 B2* | 7/2020 | Choi | H01L 21/30604 |
| 2014/0087191 A1 | 3/2014 | Chua et al. | |
| 2017/0098716 A1 | 4/2017 | Li et al. | |
| 2017/0162654 A1 | 6/2017 | Maeda et al. | |
| 2019/0165107 A1* | 5/2019 | Park | C23C 14/22 |
| 2019/0194128 A1* | 6/2019 | Hohman | B01J 35/004 |
| 2019/0216715 A1* | 7/2019 | Nam | A61K 8/23 |
| 2019/0383770 A1* | 12/2019 | Choi | C12Q 1/6869 |

FOREIGN PATENT DOCUMENTS

| | | |
|---|---|---|
| CN | 106409687 A | 2/2017 |
| JP | 2015231682 A | 12/2015 |
| WO | 2016/203184 A1 | 12/2016 |

OTHER PUBLICATIONS

Li, C., et al., Devices and applications of van der Waals heterostructures, Journal of Semiconductors, Mar. 2017, vol. 38, No. 3, pp. 031005-1-031005-9.
Yang, R., et al., Multilayer MoS2 transistors enabled by a facile dry-transfer technique and thermal annealing, Journal of Vacuum Science & Technology, Oct. 16, 2014, vol. 32, No. 6, pp. 061203-1-061203-9.
Gong, Y., et al., Vertical and In-Plane Fleterostructures from $WS_2$/$MOS_2$ Monolayers, Nature Materials, Sep. 28, 2014, vol. 13, pp. 1135-1142.
Fang, H., et al., Strong interlayer coupling in van der Waals heterostructures built from single-layer chalcogenides, Proceedings of the National Academy of Sciences of the United States of America, Apr. 29, 2014, vol. 111, issue 17, pp. 6198-6202.
Lee, S., et al., Graphene transfer in vacuum yielding a high quality graphene, Carbon, May 21, 2015, vol. 93, pp. 286-294.
Jeon, J., et al., Layer-controlled CVD growth of large-area two-dimensional MoS, films, Nanoscale, Oct. 21, 2014, vol. 7, pp. 1688-1693.
Roy, T., et al., Dual-Gated $MoS_2$/$WSe_2$ van der Waals Tunnel Diodes and Transistors, ACS Nano, Jan. 19, 2015, vol. 9, issue 2, pp. 2071-2079.
Island, J.O., et al., Thickness dependent interlayer transport in vertical $MoS_2$ Josephson junctions, 2D Materials, Jul. 1, 2016, vol. 3, article 031002, pp. 1-6.
Kang, K., et al., High-mobility three-atom-thick semiconducting films with wafer-scale homogeneity, Nature, Apr. 30, 2015, vol. 520, pp. 656-660.
Tsuboi, Y., et al., Enhanced Photovoltaic Performances of Graphene/Si Solar Cells by Insertion of MoS, Thin Film, Nanoscale, Aug. 10, 2015, vol. 7, pp. 14476-14482.

* cited by examiner a b

TRANSITION METAL CHALCOGENIDE VAN DER WAALS FILMS, METHODS OF MAKING SAME, AND APPARATUSES AND DEVICES COMPRISING SAME

CROSS REFERENCE TO RELATED APPLICATIONS

This application claims priority to U.S. Provisional Application No. 62/360,053, filed on Jul. 8, 2016, the disclosure of which is hereby incorporated by reference.

STATEMENT REGARDING FEDERALLY-SPONSORED RESEARCH OR DEVELOPMENT

This invention was made with government support under NSF DMR-1120296 awarded by the National Science Foundation and under FA2386-13-1-4118 awarded by the Air Force Office of Scientific Research. The government has certain rights in the invention.

FIELD OF THE DISCLOSURE

The disclosure generally relates to transition metal chalcogenide van der Waals films. More particularly the disclosure generally relates to methods of making van der Waals films by stacking monolayer transition metal chalcogenide films.

BACKGROUND OF THE DISCLOSURE

Thin film processing with composition and thickness control is essential for modern semiconductor technology. Accordingly, reaching a fundamental limit of controllability down to atomic level in large scale would allow us to design innovative artificial materials for practical applications such as quantum electronics and photonics.

Currently, the uniform monolayer building block of TMDs in large scale is available using metal-organic chemical vapor deposition (MOCVD). However, existing methods to assemble the VDW films show poor controllability and/or scalability up to date. For example, direct growth of multi-layer VDW films uniform in large scale is not preferred because there is only weak driving force to induce homogeneous nucleation on each layer. In parallel, layer-by-layer stacking using exfoliated flakes is limited to micron-meter size without scalability. Furthermore, the cleanliness at the stacking interface is not guaranteed since air bubbles or amorphous carbon can be trapped during the process.

BRIEF SUMMARY OF THE DISCLOSURE

In an aspect, the present disclosure provides VDW films. VDW films comprise a plurality of monolayer transition metal dichalcogenide (TMD) films. The monolayer TMD films are stacked. By "stacked" it is meant that each layer is in contact with at least one other layer and at least partially overlaps with one or both other (e.g., adjacent) layers. The individual TMD films interact via van der Waals forces. FIG. 1 presents a representative VDW film with programmable compositions and clean interface.

VDW films can be free-standing films or disposed on a substrate or surface. Various substrates can be used. A substrate can be a solid substrate or a fluid (e.g., liquid) substrate.

A monolayer TMD film can include one or more transition metal sulfides and/or one or more transition metal selenides. In various examples, a monolayer TMD film comprises $MoS_2$, $WS_2$, $NbS_2$, $MoSe_2$, $WSe_2$, $MoTe_2$, $WTe_2$, $NbSe_2$, or a combination thereof.

The scalability allows industrial application. The monolayer control (three-atom-thick) of a VDW film allows ultimate structural/composition control. The clean interfaces of a VDW films allow flat surface, high structural stability, good optical properties and high mechanical strength (e.g., it allows suspension as atomically-thin membranes with high aspect ratio (lateral dimension/thickness) of 0.2 million or less or 0.1 million or less, or 0.05 million or less).

In an aspect, the present disclosure provides apparatuses comprising one or more VDW films of the present disclosure. The apparatuses have one or more VDW films of the present disclosure and/or one or more VDW films made by a method/methods of the present disclosure.

In an example, the apparatus is a hybrid structure and the apparatus comprises, consists, or consists essentially of: optionally, a substrate, and a plurality of VDW films, and a plurality of non-TMD layers. One or more of the VDW films may be disposed on at least a portion of the substrate. The hybrid structures comprising non-TMD layers can form atomically-thin circuits.

In an aspect, the present disclosure provides methods of making VDW films and/or apparatuses comprising VDW films. The methods are also referred to herein as PVS processes/methods or VSDP processes/methods. In the methods, TMD monolayers are assembled by VDW interaction to provide TMD VDW films.

The methods are based on mechanical release (e.g., dry peeling) of TMD monolayers from a formation substrate and vacuum stacking of individual TMD films. The films are formed using van der Waals forces. The methods can be used to make VDW films of the present disclosure. FIG. 2(a) illustrates examples of an instant VSDP process for generating high quality, programmable VDW films as shown in FIG. 1. A method of making a VDW film can further comprise formation of non-TMD monolayers.

In an aspect, the present disclosure provides devices. The devices comprises one or more VDW films and/or one or more apparatuses of the present disclosure. Examples of devices include, but are not limited to, quantum electronic, mechanic, and photonic devices. Additional examples of devices include, but are not limited to, tunnel devices, capacitors, diodes, membranes, optical windows, transparent electronic devices, optical devices, micro-electromechanical system devices, mechanical devices, optomechanical devices, optoelectrical devices, flexible electronics, and bio-compatible electronics.

DESCRIPTION OF THE FIGURES

For a fuller understanding of the nature and objects of the disclosure, reference should be made to the following detailed description taken in conjunction with the accompanying figures.

DETAILED DESCRIPTION OF THE DISCLOSURE

Figure 1:
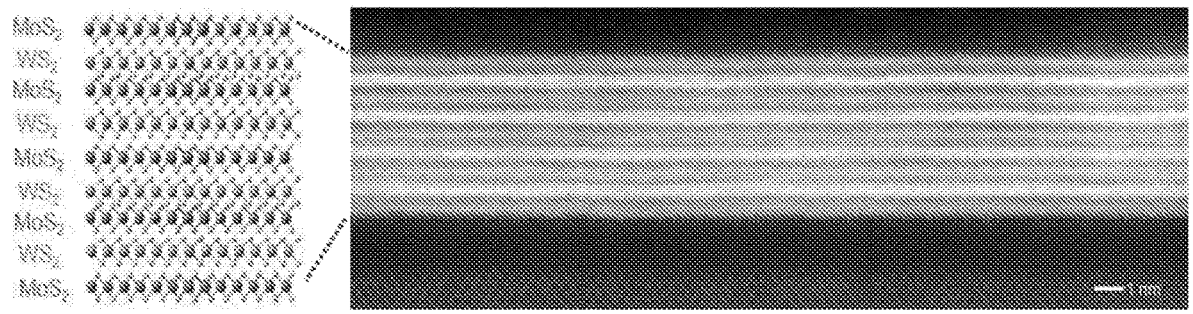
FIG. 1 presents a VDW film with programmable compositions and ultraclean interface in accordance with the present disclosure.
Figure 1:
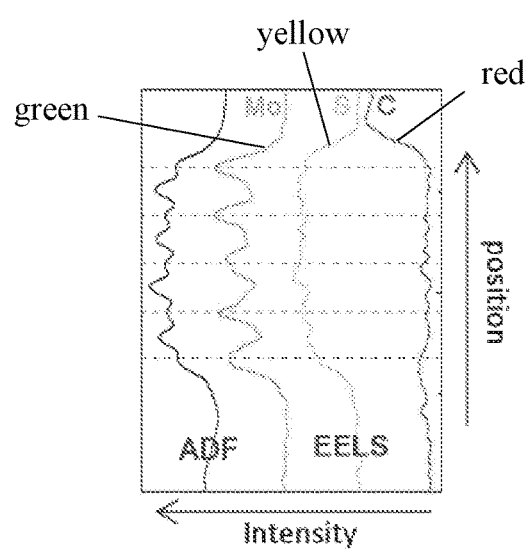

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

The present disclosure provides van der Waals (VDW) films and methods of making VDW films. The present disclosure also provides apparatuses and devices comprising VDW films.

The embodiments disclosed herein disclose a vacuum stack and dry peel (VSDP) method to achieve high quality VDW films in large scale.

High quality and large scale VDW films, assembled by monolayer building blocks, allows artificial design of the material at atomic level for advanced devices such as quantum electronic, mechanic, and photonic devices. The embodiments herein disclose newly-developed stacking technique for VDW films, which provides i) large scale processing up to 2 inches (e.g., length, width, or diameter) based on the various monolayer TMD building blocks (e.g., $MoS_2$, $MoSe_2$, $WS_2$, and $WSe_2$) grown by MOCVD; ii) programmability in the VDW film via layer-by-layer assembly; and iii) ultraclean interface through dry peeling and stacking in vacuum (e.g., less than 200 mTorr). The high quality of the as-produced VDW film is investigated by using cross-sectional STEM and EELS with atomic resolution. The accurate programmability of our process is demonstrated electrically with tunnel device array in large scale, where the number of layer can be controlled, for example, with a standard deviation corresponding to less than 0.15 layers and tunnel resistance tuned up to ~$10^4$ with different compositions. With the use of VSDP process, a new material platform is also demonstrated with free standing VDW films, which are expected to provide, for example, atomically thin membrane mechanics, optics and electronics.

The instant methods can provide one or more of the following advantages:
i) use of ultrathin building block in large scale,
ii) VDW films with composition programmability, without the need for chemical bonding and crystal matching between layers,
iii) well-defined, intrinsic interfaces,
iv) diverse material combination (including, for example, metal, semiconductor, superconductor and magnetic materials), and
v) VDW films with layer thickness controllability at sub-nm scale thickness.

These advantages are expected to allow precise engineering of advanced devices such as, for example, quantum electronic, mechanic, and photonic devices.

In an aspect, the present disclosure provides VDW films. VDW films comprise a plurality of monolayer transition metal dichalcogenide (TMD) films. The monolayer TMD films are stacked. By "stacked" it is meant that each layer is in contact with at least one other layer and at least partially overlaps with one or both other (e.g., adjacent) layers. The individual TMD films interact via van der Waals forces.

FIG. 1 presents a representative VDW film with programmable compositions and clean interface. FIG. 1(*a*) shows a cross sectional annular dark field TEM image of a VDW film, where the contrast of $MoS_2$ layers (dark) and $WS_2$ layers (bright) are clearly distinguishable due to the atomic number difference (also see in the contrast profile in FIG. 1(*b*)). Observations from FIG. 1(*a*) include the following. First, the VDW film forms a superlattice, monolayer $MoS_2$/monolayer $WS_2$ alternative structure as we designed (schematics in FIG. 1(*a*)), and it shows monolayer scale controllability of composition and thickness. Second, the individual layers show uniform, continuous, and straight monolayer and are parallel to each other. Third, the interlayers maintain extremely clean and bubble/wrinkle free interface with constant distance ~0.638 nm, which is expected value for $MoS_2$/$WS_2$ stacking with random crystal orientation (further discussion in Example 1). The corresponding elemental analysis along the stacking direction from EELS are shown in FIG. 1(*b*). The molybdenum concentration exactly matches the location of $MoS_2$ layer in FIG. 1(*a*), while sulfur is uniform everywhere for both $MoS_2$ and $WS_2$. Carbon, on the other hand, is not detectable under our instrument resolution inside the stack, which also supports the cleanliness of the interface. The above analysis confirms that our stacking process provide the composition controllability at monolayer scale in programmable manner, and an interface quality without unwanted defects. The interface may be configured to have no detectable carbon residues, atomically sharp interface, and/or no bubbles/wrinkles. For example, the interface may include less than one carbon chunk (particle) or air bubble per a 2 μm×2 μm area. The cleanliness level may be a root mean square (RMS) roughness smaller than 300 μm and/or less than 0.1% carbon residue between layers.

A VDW film can comprise different kinds of TMD monolayer to form heterostructures (e.g., superlattices). A VDW film can be a heterostructure. For example, a heterostructure comprises two or more TMD monolayers having different composition. Non-limiting examples of heterostructures include ABCDBCDA, ABC, AB, AC, and the like (e.g., where A, B, and C are TMD layers/monolayers having different composition). A VDW film can be a superlattice. For example, a superlattice comprises alternating heterostructures. A non-limiting example of a superlattices is ABABABABAB (e.g., where A and B are TMD layers/monolayers having different composition).

VDW films can be free-standing films or disposed on a substrate or surface. Various substrates can be used. A substrate can be a solid substrate or a fluid (e.g., liquid) substrate. In various examples, the substrate comprises or consists of at least one of $Al_2O_3$, $SiO_2$, silicon (Si), or other metal or metalloid oxide(s). In various examples, the substrate comprises or consists of a polymeric material or polymer (e.g., polyethylene terephthalate). In an example, the substrate is skin (e.g., mammal skin such as, for example, human skin.

In another example, the substrate is an aqueous substrate (e.g., water). For example, where the substrate is an aqueous substrate (e.g., water) a VDW film is formed on a substrate, e.g., $SiO_2$, and then the VDW film/$SiO_2$ is contacted with an aqueous medium (e.g., water). The VDW film will float on the surface of the aqueous medium (e.g., water), but the $SiO_2$ substrate will sink in the aqueous medium.

A monolayer TMD film can include one or more transition metal sulfides and/or one or more transition metal selenides. In various examples, a monolayer TMD film comprises $MoS_2$, $WS_2$, $NbS_2$, $MoSe_2$, $WSe_2$, $MoTe_2$, $WTe_2$, $NbSe_2$, or a combination thereof.

A VDW film can have desirable cleanliness. For example, a VDW films have one particle of carbon per 2 micron×2 micron area. In another example, a VDW film has less than 0.1% by weight carbon (e.g., carbon particles and/or hydrocarbons) between layers (e.g., at the interface between layers). In yet another example, a VDW film has no detectible carbon (e.g., carbon particles and/or hydrocarbons). Carbon can be detected by methods known in the art. In various examples, carbon is detected by electron energy loss spectroscopy (EELS), high-angle annular dark field (HAADF), or scanning transmission electron microscopy (STEM) imaging.

A VDW film has desirable surface roughness. In an example, a VDW film has a root mean square (RMS) roughness less than 300 pm. In another example, a VDW film has a root mean square (RMS) roughness less than 200 pm. The surface roughness can depend on the surface roughness of the growth substrate. In an example, a VDW film has a root mean square (RMS) roughness less than 300 pm, so long as the growth substrate does not have a RMS roughness of 300 pm or greater. In another example, a VDW film has a root mean square (RMS) roughness less than 200 pm, so long as the growth substrate does not have a RMS roughness of 200 pm or greater. In various examples, a desired surface roughness, which can be greater than 300 pm, is intentionally produced.

A VDW film can have a desirable amount of defects. For example, a VDW film has less than one bubble (e.g., air bubble) and/or wrinkles per 2 micron×2 micron area. In another example, a VDW film has not observable bubbles and/or wrinkles at the monolayer TMD film interface(s). Bubble and/or wrinkles can be detected by methods known in the art. In various examples, bubbles and/or wrinkles are detected by atomic force microscopy (AFM), optical microscopy, scanning electron microscopy (SEM), Raman spectroscopy, or use of a tunnel device or capacitor device.

A VDW film can have desirable material quality of each layer and/or overall film (e.g. electrical properties, optical properties). For example, each layer in a VDW film can be optimized before stacking to have high mobility of, for example, 30 $cm^2$ $V^{-1}s^{-1}$ or greater, and high photoluminescence intensity. For example, a VDW film can sustain high breakdown of voltage up to ~0.5 V/nm or higher.

The scalability allows industrial application. The monolayer control (three-atom-thick) of a VDW film allows ultimate structural/composition control. The clean interfaces, which can be ultra-clean interfaces, of a VDW films allow flat surface, which can be an ultra-flat surface, high structural stability, good optical properties (e.g. less optical loss) and high mechanical strength (e.g., it allows suspension as atomically-thin membranes with high aspect ratio (lateral dimension/thickness) of 0.2 million or less or 0.1 million or less, or 0.05 million or less).

In an aspect, the present disclosure provides apparatuses comprising one or more VDW films of the present disclosure. The apparatuses have one or more VDW films of the present disclosure and/or one or more VDW films made by methods of the present disclosure.

In various examples, an apparatus comprises, consists, or consists essentially of: optionally, a substrate, and one or more VDW films. One or more of the VDW films may be disposed on at least a portion of the substrate.

In an example, the apparatus is a hybrid structure and the apparatus comprises, consists, or consists essentially of: optionally, a substrate, and a plurality of VDW films, and a plurality of non-TMD layers. One or more of the VDW films may be disposed on at least a portion of the substrate. The hybrid structures comprising non-TMD layers can form atomically-thin circuits.

Non-TMD layers can be formed by methods known in the art. For example, non-TMD layers can be formed by spin-coating (e.g., organic materials), thermal/e-beam evaporation (e.g., metal and oxide materials), sputtering (e.g., metal materials), ALD (e.g., oxide materials), Langmuir-Blodgett technique (e.g., nanocrystals and quantum dots), dip-coating (e.g., organic materials, nanocrystal, metal-porphyrin molecules, and metal organic framework compounds), physical vapor deposition (e.g., metal-porphyrin molecules). These steps can be carried out before and/or in between individual TMD monolayer formation (e.g., individual peel-and-stack steps for each newly-added layers) to form, for example, TMD monolayer/non-TMD layer/TMD monolayer/non-TMD layer/ . . . hybrid structures.

Non-TMD layers (e.g., films) are disposed on a VDW film. Non-TMD layers are stacked vertically, layer by layer, along with the TMD monolayer building blocks. Non-limiting examples of non-TMD layers includes layers such as metal layers (e.g., metals such as, for example, Au, Ag, Al, Nb, Ni, and the like), oxide layers (e.g., non-metal and metalloid oxide films such as, for example, hafnium oxides, silicon oxides, aluminum oxides, and the like), organic (e.g., organic polymer films) films, and self-assembled nanostructures (e.g., metal-porphyrin molecules, metal organic framework compounds, covalent organic frameworks compounds). Each non-TMD layer is separated from other non-TMD layers by at least one VDW film.

Various substrates can be used. Non-limiting examples of various substrates are provided herein.

Various VDW films can be used. In the case where the apparatus has multiple VDW films, the films can have the same or different nominal composition and/or the VDW films can be free-standing films and/or VDW disposed on at least a portion of a substrate.

In an aspect, the present disclosure provides methods of making VDW films and apparatuses. The methods are also referred to herein as PVS processes/methods and VSDP processes/methods. In the methods, TMD monolayers are assembled by VDW interaction to provide TMD VDW films.

The methods are based on mechanical release (e.g., dry peeling) of TMD monolayers from a formation substrate and vacuum stacking of individual TMD films. The films are formed using van der Waals forces. The methods can be used to make VDW films of the present disclosure. In an example, a method does not use a solvent (e.g., an organic solvent).

In an example, a method of making a VDW film comprises: providing a plurality of large area transition metal dichalcogenide (TMD) monolayers (e.g., a plurality of large area transition metal dichalcogenide (TMD) monolayers) on a substrate (a formation substrate); dry peeling at least one of the TMD monolayers from the substrate; layer-by-layer stacking at least one of the TMD monolayers (e.g., by dry peeling at least one of the TMD monolayer from the formation substrate and transferring the TMD monolayer to a substrate under vacuum to form a Van der Waals (VDW) film.

FIG. 2(a) illustrates examples of an instant VSDP process for generating high quality, programmable VDW films as shown in FIG. 1. In step 1, a series of wafer scale TMD monolayers on $SiO_2$/Si substrate are prepared by MOCVD. Other techniques besides MOCVD that enable mechanical peeling also can be used. Step 2, the initial layer (L0) is separated from the growth substrate by dry peeling with poly(methyl methacrylate) (PMMA) tape or other thermal release tape (TRT). Step 3, L0/TRT and the next TMD layer (L1) on substrate are put into a vacuum box and pressed into contact in vacuum. Step 4, L1/L0/TRT is peeled off from the substrate. The last two steps can be repeated until the desired number of layers (N) is reached. In the final step 5, the N-layer TMD film is released from TRT to any target, in either supported or suspended form, for further characterizations and applications.

The structure formed using the VSDP process is different from using other techniques. First, the controllability of thickness or composition is at a monolayer level (sub-nm), which cannot be achieved by MOCVD or ALD. Second, the various material combination of heterostacking is allowed for our process since each interfaces combined by weak van der Waals interaction. However, MOCVD or ALD method are only allowed for specific material combination under consideration of their epitaxial relation, lattice constant, chemical bonding, or surface energy.

In VSDP process, the high quality MOCVD-grown films can be completely separated from the growth substrates with solely mechanical force (e.g., "dry peeling") due to extremely low interaction with the growth surface. The dry peeling can ensure an ultra-clean bottom surface without any chemicals such as etchant or solvent for the following stacking. In addition, stacking individual monolayer in the vacuum (vacuum stacking) further improves the interface quality by avoiding air exposure when the stamp layers contact as-grown target samples. The vacuum stacking and dry peeling are repeatable for multi-stacked films as long as TMD-TMD interaction is stronger than TMD-growth substrates, which is governed by stacking condition (see Example 1).

Figure 2:
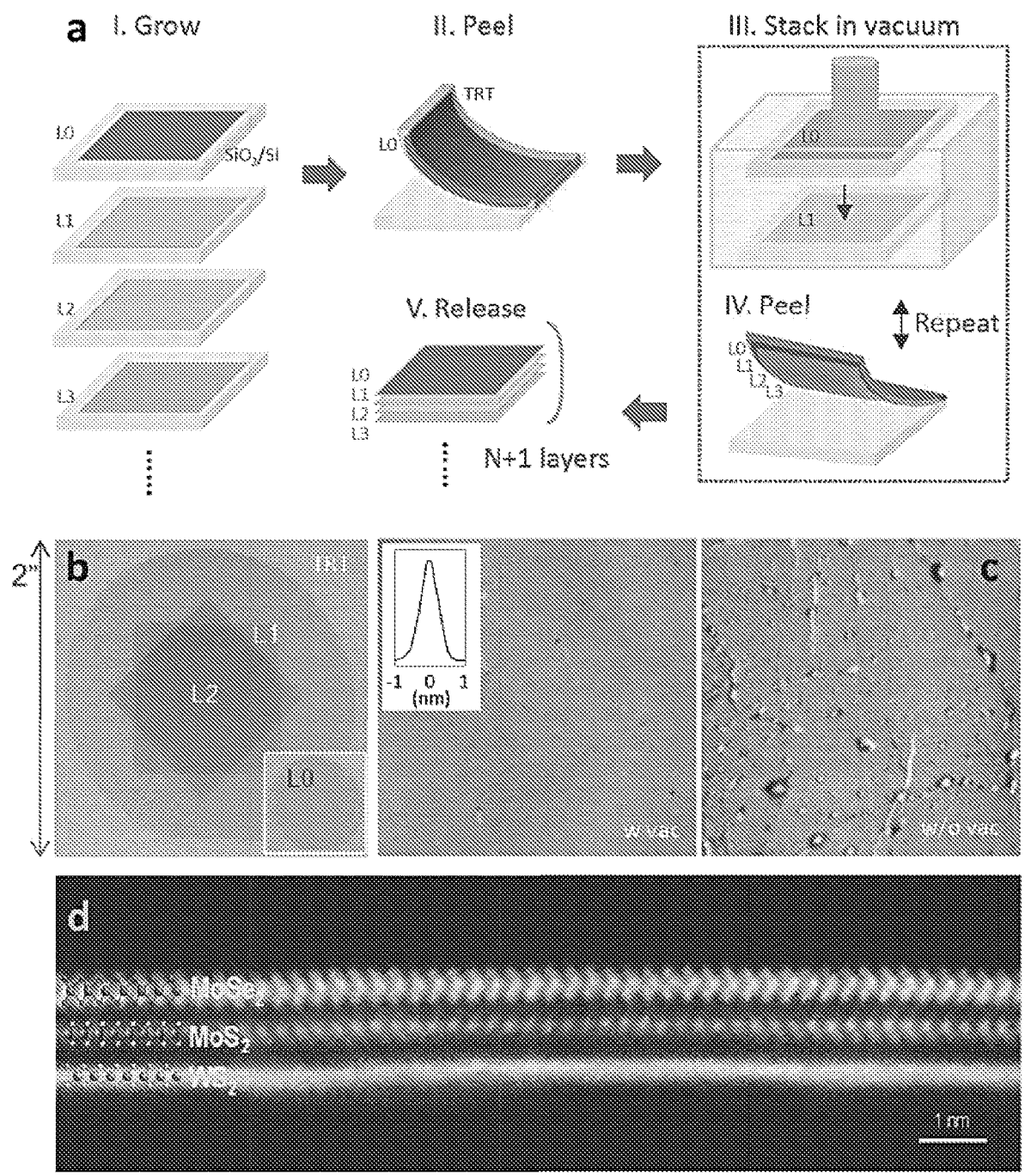
FIG. 2 illustrates a VSDP process for generating high quality, programmable VDW films as shown in FIG. 1.

FIG. 2(b-d) demonstrate the resulting VDW film from VSDP process is scalable, ultra-clean, programmable and universal to various TMDs. FIG. 2(b) displays photos of three layer $MoS_2$ stacked in wafer scale on TRT during the process. The inset photo shows the initial layer L0 from a 2 inch wafer on the TRT after the first peeling. Two more $MoS_2$ layers L1, L2 from 1 inch square substrates are then stacked as in the main photo, where clear contrast between different N's can be observed. Further optical characterizations of our large scale VDW films depending on N are presented in SI.

FIG. 2(c) shows the surface roughness of the VDW films by atomic force microscopy (AFM) to manifest the effect of vacuum stacking. Images are taken at the bottom surface of 3-layer $MoS_2$ films when the stacking is conducted in vacuum (left) or in ambient (right). As shown, the right image has bubble-like features (RMS ~700 pm) on the surface, while the left image appears to be smooth (RMS ~270 pm). Therefore, we conclude that vacuum-stacking greatly improves the cleanness at the interface in our film, which may be necessary to build these VDW films with consistent quality.

The cross-sectional STEM image in FIG. 2(d) shows $MoSe_2$/$MoS_2$/$WS_2$ VDW films prepared by VSDP. Even though there is a lattice mismatch between $MoSe_2$ and $MoS_2$ (~4%), as well as an interlayer rotation between $MoS_2$ and $WS_2$, VDW films still forms without misfit dislocations (Example 1). Our programmable VSDP can be applied to be universal TMD monolayers in any combination regardless their lattice difference and rotation angle.

The membrane can include alternating $MoS_2$ and $WS_2$ monolayers or other combinations of different monolayers. For example, the TMD stack can include half $MoS_2$ and half $WS_2$.

The large area TMD stack can be at least three, at least six, or at least nine layers thick. In an example, twenty layers are stacked. Even larger numbers of stacked layers are possible.

Figure 3:
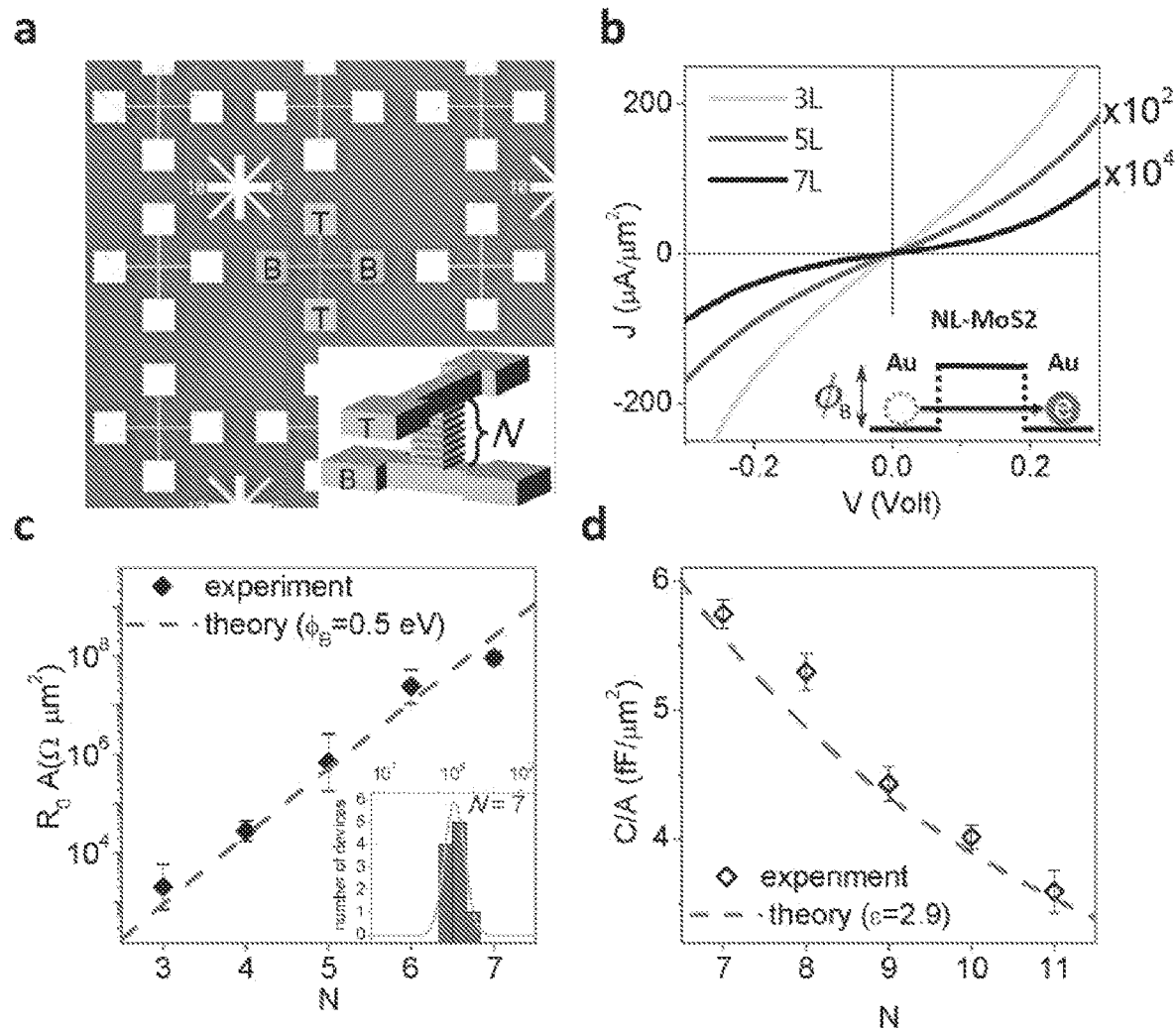
FIG. 3 illustrates the large scale layer-by-layer programmability in VSDP process with tunnel device/capacitor array over a large area.

We demonstrated the large scale layer-by-layer programmability in VSDP process with tunnel device/capacitor array over a large area shown in FIG. 3(a), since high material quality is required for the devices. As an example, the tunnel current is exponentially sensitive to i) barrier width, determined by N and ii) barrier height, determined by the composition of the VDW film. Therefore, controllable tunnel characteristics over large area requires process with precise and uniform control in thickness, doping as well as compositions in large scale, which has not been achieved by any means to date. Here, VSDP enables us to fabricate device array in large scale by standard photolithography (see Example 1), and the accurate programmability is confirmed in FIGS. 3 and 4.

We first show our layer-by-layer control of N with vertical gold/$MoS_2$/gold sandwiched structure for tunnel device. Tunnel devices form when the VDW film is sandwiched vertically by metals with work function deep inside its band gap (e.g., schematics in FIG. 3(b) for gold and $MoS_2$). In FIG. 3(b), all representative devices indeed show general tunneling I-V characteristic with exponentially decreasing current when N increases. Quantitatively, we plot the zero-bias tunneling resistance ($R_0A$) as a function of N in FIG. 3(c). Our experiment data (diamonds) follow the tunneling equation (dash line) when the barrier height is $\phi_B$=0.5 eV (detail in Example 1). Moreover, the device array with N=7 (inset) shows excellent spatial uniformity with the uncertainty less than 35% of the average, equivalent to as small as 0.15 layer variation. Note that all devices have working area as big as 5×5 $\mu m^2$ and distributed over ~5×5 $mm^2$ on chips for each N, showing the large area uniform control and consistent reproducibility of VSDP process.

In FIG. 3(d), we further confirm our control over N through capacitance measurement. Similarly, the N-dependence of $MoS_2$ capacitors (empty diamonds) shows small variations and follows the parallel plate capacitor equation (dash line) when dielectric constant is $\varepsilon_{MoS2}$=2.9, close to previous reported value for monolayer $MoS_2$ (detail in Example 1). The consistent values and trend in both cases above shows that VSDP process indeed provides uniform control over N at monolayer level. Moreover, devices shown here come from many batches of MOCVD growth and fabrication, which further indicates the consistency of VSDP process.

Figure 4:
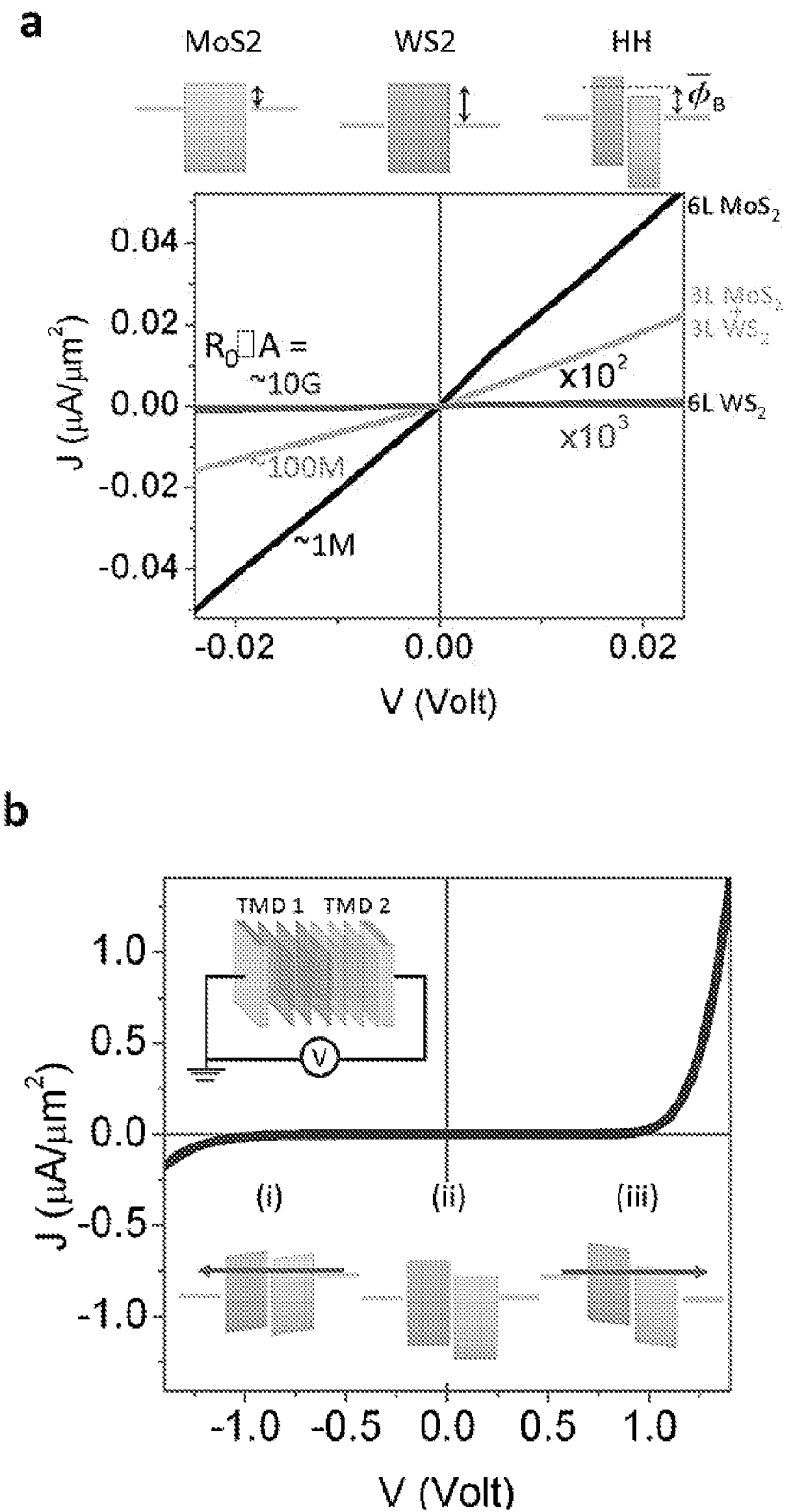
FIG. 4 illustrates the composition programmability when N is fixed.

In parallel, FIG. 4 shows the composition programmability when N is fixed. Three different VDW films are programmed as examples: $MoS_2$ (6 layer), $WS_2$ (6 layer), and $MoS_2$(3 layer)/$WS_2$(3 layer), noted as Mo/W. Their tunneling I-V curves at nearly zero bias are measured in FIG. 4(a), which show exponentially different tunnel resistance according to their band structure (see schematics). For $MoS_2$ and $WS_2$, despite their similar band gap, the ~0.4 eV higher band offset of $WS_2$ makes it a higher barrier. Therefore, $WS_2$ shows 10,000 times larger tunnel resistance at the same thickness compared to $MoS_2$. On the other hand, the intermediate resistance can be generated by the Mo/W film as shown, because the effective barrier height of Mo/W at small bias is theoretically the average of its components, $MoS_2$ and $WS_2$. The agreement between experiment results and theoretical band structures here confirms our control over the compositions.

Furthermore, based on the programmed band structure, the ultra-thin Mo/W (~3 nm) is theoretically predicted to behave as the metal-insulator-insulator-metal (MIIM) tunnel diode at large bias. Indeed, this diode behavior is observed in FIG. 4(b). The operation of MIIM is illustrated as the inset schematics: (ii) shows the zero-bias regime, as in FIG. 4(a); in (iii), a large positive voltage V is applied to $MoS_2$ and bends part of the conduction band below the fermi level, allowing electrons to tunnel from gold into $MoS_2$; in contrast, electrons still have to go through the full barrier at –V in (i), due to the higher band offset in $WS_2$. The different effective barrier width therefore attributes to the asymmetric I-V curve. This behavior of Mo/W mixture not only shows our programmability, but points out a way via VSDP for new physical properties that cannot be achieved with single element system.

FIG. 1-4 confirms the layer-by-layer programmability of compositions and ultraclean interface between layers in our VDW films via VSDP process, which enable us to design artificial material with atomic control close to fundamental limits. Moreover, VSDP process also allow us to separate the programmable VDW films from the substrates as a free standing membrane in large scale to take the advantage of its ultra-thinness.

Figure 5:
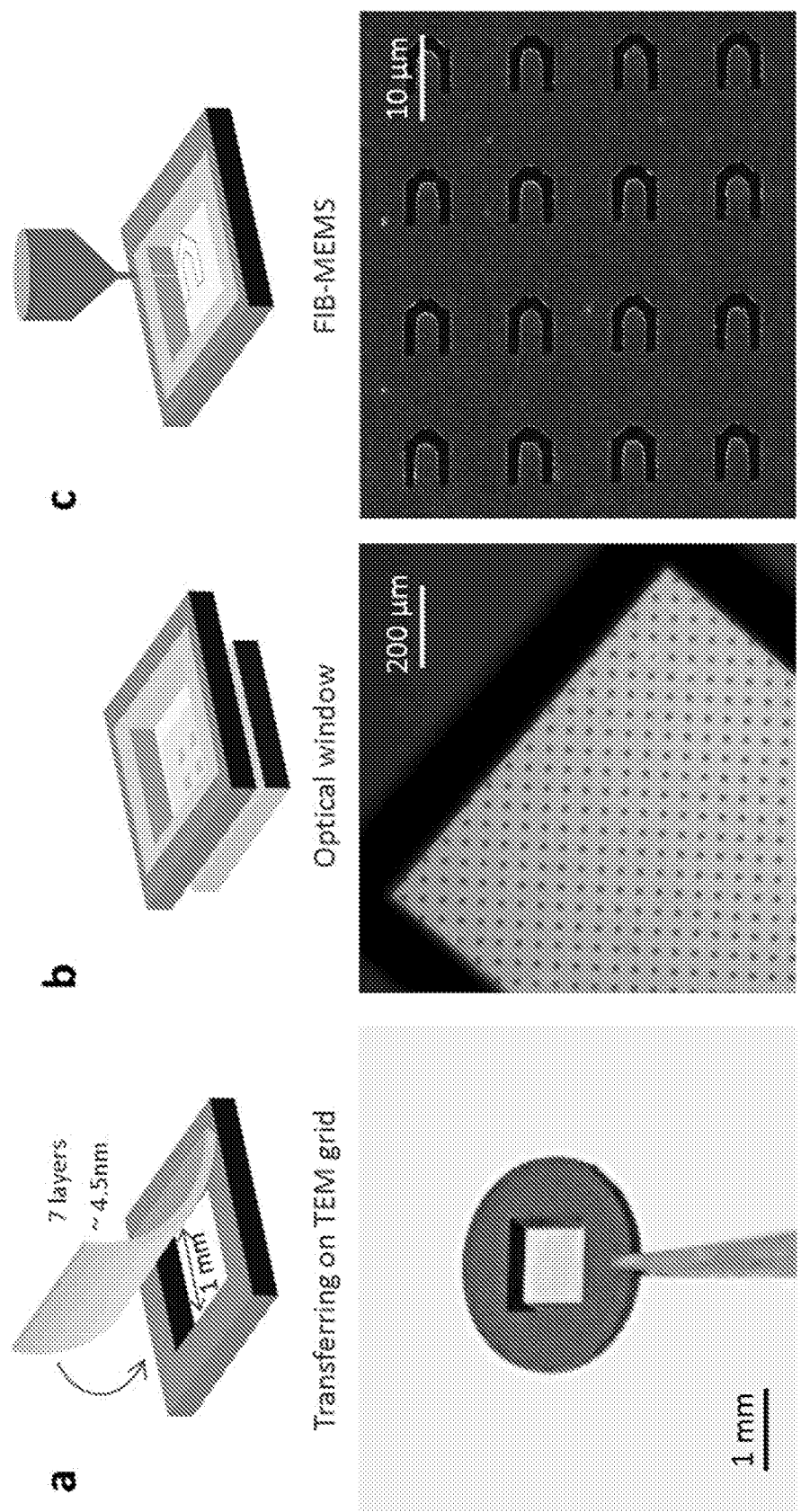
FIG. 5 illustrates generating the freestanding VDW membrane and demonstrating its potential applications.

In FIG. 5, we generate the freestanding VDW membrane and demonstrate its potential applications. As shown in FIG. 5a, the VDW film is transferred on a TEM chip with 1×1 $mm^2$ hole at the center (see schematics). Bottom photo shows an example of fully suspended 7-layer $MoS_2$ films over the hole with clear yellowish surface. Our suspended membrane is successfully demonstrated since the TMD monolayer can be completely separated from the substrate and stacked without holes, wrinkles and cracks (Example 1). In addition, the film is only ~5 nm thick over 1 mm hole, giving one of the highest aspect ratio (length:thickness) of $2\times10^6$:1, which can provide an atomically thin material platform in technologically relevant scale toward future membrane mechanics, optics and electronics as well as the integration of them.

In FIGS. 5(b) and (c), we demonstrate applications of the VDW membrane that can be potentially integrated with others for practical uses. In FIG. 5(b), patterned gold on fused silica is imaged clearly through the $MoS_2$ membrane (schematics on top) by optical microscope under white light illumination. The high transparency, inherent from its ultra-thinness, makes it a promising platform for optical windows or transparent electronics. In FIG. 5(c), the scanning electron microscope (SEM) image shows the freestanding cantilever array patterned by focused ion beam (FIB). FIB allows us to pattern arbitrary shape on atomically thin membrane, which would lead to new class of micro-electromechanical systems (MEMS).

The VSDP processes disclosed herein illustrate new methods for precise material programming down to atomic level with ultraclean interface. Its process works up to wafer scale and allows final VDW films in either form of on-substrate or substrate-free. Our method is expected to be universal to any layered materials or even patterned atomically thin circuitry, as long as the materials can be separated from substrates with a clean method. The new capability brought in by VSDP process may, in principle, accelerate the use of layered materials for physical systems and state-of-the-art technology, which is potentially beneficial to both academia and industry.

TMD layers/monolayers can be formed by methods known in the art. TMD layers/monolayers can be formed using metal-organic chemical vapor deposition (MOCVD). For example, a TMD layer/monolayer or TMD layers/monolayers are formed by methods disclosed in U.S. patent application Ser. No. 15/130,407 (titled "MONOLAYER FILMS OF SEMICONDUCTING METAL DICHALCOGENIDES, METHODS OF MAKING SAME, AND USES OF SAME"), which was published as U.S. Patent Application Publication No. US 2016/0308006, the disclosure of which with respect to formation of TMD layers/monolayers is incorporated herein by reference.

A formation substrate is any substrate on which a TMD monolayer can be formed and from which a TMD monolayer can be mechanically released. Non-limiting examples of formation substrates include silica substrates, silica (e.g., $SiO_2$), such as, for example, quartz, PECVD grown $SiO_x$/silicon), other oxides or nitride substrates such as, for example, $Al_2O_3$ substrates (e.g., $Al_2O_3$ single crystal substrates), $Al_2O_3/SiO_2$/Si substrates, $HfO_2/SiO_2$/Si substrates, SiN/$SiO_2$/Si substrates, and the like. In an example, a formation substrate comprises an external $SiO_2$ surface).

Dry peeling can be carried out by forming a handle layer on at least a portion of a TMD monolayer disposed on formation substrate. Examples of handle layers include, but are not limited to, organic polymer layers, metal layers, metal oxide layers, and hetero-materials (e.g., thin polymer layer disposed on thick flexible polymer layer and a brittle layer (e.g., a thin metal layer) disposed on a thick flexible polymer. It is desirable that the handle layer conformally covers the portion of the TMD monolayer. It is desirable that the handle layer has a flexibility and interaction with the TMD monolayer that allows the TMD monolayer to be removed from the formation substrate and transferred to a substrate. An organic polymer handle layer can have a thickness in the millimeter range. A metal layer or metal oxide layer can have a thickness of 100 nm or less.

A handle layer can be formed using a tape. Non-limiting examples of tapes include thermal release tapes such as for example, poly(methylmetacrylate) (PMMA) and poly(vinyl acetate) (PVA) release tapes. For example, dry peeling a TMD monolayer includes attaching tape (e.g., PMMA/ thermal release tape) onto a first TMD monolayer and peeling at least one of the TMD monolayers from the substrate with the tape.

Transferring a TMD monolayer to a substrate, other TMD monolayer, or a non-TMD layer can be carried out by mechanically removing a TMD layer/monolayer from a formation substrate using a handle layer, putting the TMD layer/monolayer on the substrate, other TMD monolayer, or a non-TMD layer and applying a mechanical force to the handle layer and removing the handle layer to provide a TMD monolayer disposed on the TMD monolayer on the substrate, other TMD monolayer, or a non-TMD layer.

Mechanical force can be applied to the handle layer in various ways. In an example, mechanical force is applied to the handle layer using a stamper.

The transferring is carried out under vacuum (e.g. in a vacuum environment). In an example, the transferring is carried out a pressure of 1 Torr or less. In another example, the transferring is carried out a pressure of less than 200 mTorr. In yet another example, the transferring is carried out a pressure of 100 mTorr or less. In yet another example, the transferring is carried out a pressure of 1 Torr to 0.1 mTorr. Without intending to be bound by any particular theory, it is considered that lower pressures provide desirable VDW films.

Heating can be used to facilitate removing the handle layer from the TMD monolayer after transfer to the substrate, other TMD monolayer, or a non-TMD layer. For example, the handle layer is removed at temperatures of 50° C. to 200° C., including all integer ° C. values and ranges therebetween.

The VDW film can be formed using a layer-by-layer method resulting in a VDW film comprising a plurality of stacked TMD monolayers. In various examples, a VDW film comprises 2, 3, 4, 5, 6, 7, 8, 9, or 10 stacked TMD monolayers. In various examples, a VDW films comprises at least three, at least six, or at least nine TMD monolayers. The number of layers is not limited by any part of the method and can be add up to any number as desired. In various examples, a VDW film comprises 1-3,000 stacked TMD monolayers, including all integer number of TMD monolayers and ranges therebetween. In various examples, a VDW film comprises 1-2,000, 1-1,000, 1-500, 1-100, 1-50, 2-2,000, 2-1,000, 2-500, 2-100, or 2-50 stacked TMD monolayers, In various examples, a VDW film comprises 2 or more, 3 or more, 4 or more, 5 or more, or 10 or more stacked TMD monolayers.

A method of making a VDW film can further comprise formation of non-TMD monolayers. Non-TMD layers can be formed using methods known in the art. Non-limiting examples of methods of forming non-TMD layers include by spin-coating (organic materials), thermal/e-beam evaporation (metal/oxide), sputtering (metal), ALD (oxide), Langmuir-Blodgett technique (nanocrystals, quantum dots), dip-coating (organic materials, nanocrystal, metal-porphyrin molecules, metal organic framework compounds), physical vapor deposition (metal-porphyrin molecules). These steps can be carried out before or in between the peel-and-stack steps for each newly-added layer to form TMD/non-TMD/ TMD/non-TMD/ . . . hybrid structure.

A method can comprise one or more additional steps. For example, a method further comprises one or more heating steps. The heating, which is different than heating to remove a handle layer, comprises heating the substrate and one or more TMD layers, and one or more non-TMD layers, if present. In various examples, the substrate and one or more TMD layers, and one or more non-TMD layers, if present, is heated at a temperature of 40-200° C.

The heating conditions, including, for example, temperature and vacuum level) does not release the handle layer. Without intending to be bound by any particular theory, it is considered that such heating improves adhesion between TMD monolayers and TMD monolayer to non-TMD layer adhesion. For example, a method further comprises superacid treatment on the VDW films after transfer to a substrate and/or another VDW film.

The steps of the method described in the various embodiments and examples disclosed herein are sufficient to produce the VDW films, apparatuses, or devices of the present disclosure. Thus, in an example, a method consists essentially of a combination of the steps of the methods disclosed herein. In another example, a method consists of such steps.

In an aspect, the present disclosure provides devices. The devices comprises one or more VDW films and/or one or more apparatuses of the present disclosure.

Examples of devices include, but are not limited to, quantum electronic, mechanic, and photonic devices. Additional examples of devices include, but are not limited to, tunnel devices, capacitors, diodes, membranes, optical windows, transparent electronic devices, optical devices, microelectromechanical system devices, mechanical devices, optomechanical devices, optoelectrical devices, flexible electronics, and bio-compatible electronics.

Non-limiting examples of devices include:
i) VDF films with engineered thermal and thermoelectric properties in the vertical direction. For measurement accuracy, the thermal measurements require high quality, large-scale samples with significant thickness (e.g., greater than 15 layers);
ii) novel Josephson junction (JJ) arrays using TMD barriers to replace metal oxides. The use of TMD barriers instead of metal oxides (e.g., aluminum oxide) of JJ arrays is expected to provide independent control of the tunnel resistance and capacitance while increasing the operation temperature (e.g., using Nb, which has higher $T_c$ than Al);
iii) high current H-shape selector arrays, which can be used in, for example, low-power memory devices. H-shape tunnel barrier layers currently generated by ALD technique are usually thick (greater than 5 nm), limiting the magnitude of the tunnelling current. The instant PVS process can produce much thinner H-shape potential that it expected to produce exponentially larger tunnelling current or smaller operation voltage for lower power consumption;
iv) hybrid TMD quantum optical resonators, which would enable, for example, light-mediated remote coherent interactions among multiple TMD resonators;
v) VDW membranes/windows (e.g., greater than mm scale) (e.g., large-scale VDW membranes/windows) with desirable quality, controlled thickness, and uniformity. Such VDW membranes/windows can replace conventional SiN windows for, for example, lower optical loss and color tunable transparency; and vi) Photovoltaic devices with designed broadband absorption spectrum/external quantum efficiency by using a VDW film or films with selected composition. This will provide higher power conversion efficiency.

The following Statements provide examples of VDW films, apparatuses, methods, and devices of the present disclosure:

Statement 1. A method of forming a VDW film (e.g., a VDW film having a homostructure, heterostructure, or superlattice structure) of the present disclosure (e.g., a VDW film comprising one or more TMD monolayers), the method comprising: providing a formation substrate having one or more transition metal dichalcogenide (TMD) monolayers disposed on the formation substrate; dry peeling as described herein at least one (e.g., one) of the TMD monolayers from the formation substrate; transferring the TMD monolayer(s) to a substrate under vacuum to form a Van der Waals (VDW) film; and, optionally, repeating the providing, dry peeling, and transferring a desired number of times to form a VDW film comprising a plurality of TMD monolayers on the substrate.

Statement 2. A method according to Statement 1, further comprising growing (forming) the TMD monolayers as described herein (e.g., using metal-organic chemical vapor deposition (MOCVD)).

Statement 3. A method according to any one of the preceding Statements, where the dry peeling at least one of the TMD monolayers comprises attaching a handle layer as described herein to the TMD monolayer and removing (e.g., peeling) at least one of the TMD monolayers from the substrate using the handle layer.

Statement 4. A method according to Statement 3, wherein the handle layer is a tape (e.g., a thermal release tape).

Statement 5. A method according to Statement 4, where the tape is PMMA/thermal release tape.

Statement 6. A method according to any one of Statements 3-5, where after transferring the TMD monolayer to the substrate the TMD monolayer is released from the handle layer.

Statement 7. A method according to any one of Statements 3-6, wherein the releasing includes heating the handle layer to a release temperature.

Statement 8. A method according to any one of the preceding Statements, wherein the transferring comprises attaching at the handle layer to a stamper and contacting the TMD monolayers with the substrate or another TMD monolayer using the stamper.

Statement 9. A Van der Waals (VDW) film (e.g., a VDW film having a homostructure, heterostructure, or superlattice structure) of the present disclosure (e.g., VDW film comprising one or more transition metal dichalcogenide (TMD) monolayers), where the VDW film has no detectible carbon and/or less than one bubble defect and/or wrinkle defect per 2 micron×2 micron area and/or has less than 0.1% by weight carbon (e.g., carbon particles and/or hydrocarbons) between layers (e.g., at the interface between layers).

Statement 10. A VDW film according to Statement 9, where the VDW film comprises one or more TMD monolayers of the present disclosure (e.g., one or more TMD monolayers selected from $MoS_2$ monolayers, $WS_2$ monolayers, $MoSe_2$ monolayers, $WSe_2$ monolayers, $MoTe_2$ monolayers, $WTe_2$ monolayers, $NbSe_2$ monolayers, and combinations thereof).

Statement 11. A VDW film according to any one of Statements 9-10, where the VDW film comprises a plurality of TMD monolayers (e.g., 2-3000 TMD monolayers, 2-2000 TMD monolayers, 2-1000 TMD monolayers, 2-500 TMD monolayers, 2-100 TMD monolayers, or 2-50), or three or more TMD monolayers, six or more TMD monolayers, or nine or more TMD monolayers.

Statement 12. A VDW film according to any one of Statements 9-11, where the VDW film comprises at least two TMD layers having different composition.

Statement 13. A VDW film according to any one of Statements 9-12, where the film is disposed on a substrate.

Statement 14. An apparatus comprising one or VDW film of the present disclosure (e.g., one or more VDW film of any one of Statements 9-12) or made according to a method of the present disclosure (e.g., made according to any one of Statements 1-8).

Statement 15. An apparatus according to Statement 14, where the apparatus further comprises one or more non-TMD layers, wherein an individual non-TMD layer is not in contact with another non-TMD layer.

Statement 16. A device comprising one or more VDW film and/or one or more apparatus of the present disclosure (e.g., one or more VDW film of any one of Statements 9-13 and/or one or more apparatus of any one of Statements 14-15).

Statement 17. A device according to Statement 16, where the device is a tunnel device, a transparent electronic device, an optical device, a micro-electromechanical systems device, a mechanical device, a photovoltaic device, an optomechanical device, an optoelectrical device.

Statement 18. A device according to Statement 16, wherein the device is a capacitor, a diode, a membrane, or an optical window.

Statement 19. A device according to Statement 16, wherein the device is a Josephson junction (JJ) array, a high current H-shape selector array, or quantum optical resonator.

The following examples are presented to illustrate the present disclosure. They are not intended to limiting in any matter.

Example 1

This example provides a description of apparatuses and methods of the present disclosure.

The realization of high quality and large scale VDW films, assembled by monolayer building blocks, would allow artificial design of the material at atomic level for advanced devices such as quantum electronic, mechanic, and photonic devices. We describe a newly-developed stacking technique for VDW films, which provides i) large scale processing up to 2" based on the various monolayer TMD building blocks ($MoS_2$, $MoSe_2$, $WS_2$, and $WSe_2$) grown by MOCVD; ii) programmability in the VDW film via layer-by-layer assembly; iii) ultraclean interface through dry peeling and stacking in vacuum. The high quality of the as-produced VDW film is investigated by using cross-sectional STEM and EELS with atomic resolution. The accurate programmability of our process is demonstrated electrically with tunnel device array in large scale, where the number of layer can be controlled with standard deviation corresponding to less than 0.15 layers and tunnel resistance tuned up to ~$10^4$ with different compositions. With the use of VS process, a new material platform is also demonstrated with free standing VDW films, which would provide the basis toward future atomically thin membrane mechanics, optics and electronics.

Material architecture with precise composition and thickness controllability has been a central interest for modern science and technology. For instance, epitaxial layer-by-layer deposition including molecular beam epitaxy (MBE) and pulsed laser deposition (PLD) is one of the prominent techniques, and it has led to applications from light-emitting diode (LED), quantum cascade laser to new physical system (1-4). Recently, the discovery of atomically thin layered materials such as graphene, h-BN and transition metal dichalcogenides (TMD) triggered a novel concept, sequential layer-by-layer assembly of individual ultra-thin building blocks, to achieve ultimate controllability down to atomic scale with diverse material combination. The materials generated by this process are named as van der Waals (VDW) films since the building blocks are assembled by non-epitaxial VDW interaction between each layers. Currently, these atomically thin building blocks can be readily grown as uniform monolayer in large scale through chemical vapor deposition (CVD). However, existing methods to assemble them into VDW films are primarily developed for small scale samples from exfoliation method, which is limited to micrometer size without scalability. Furthermore, the cleanness at the stacking interface is not guaranteed with current methods since air bubbles or amorphous carbon can be trapped during the process. Herein we describe our new process based on TMD building blocks that incorporates i) large-scale monolayer TMDs grown by the recently developed metal-organic chemical vapor deposition (MOCVD) and ii) vacuum stack (VS) method, which we specifically design to realize large scale assembly with ultraclean interface. With the use of this process, we successfully demonstrate the fabrication of VDW films in large scale while having material control down to atomic level with ultraclean interfaces.

Figure 7:
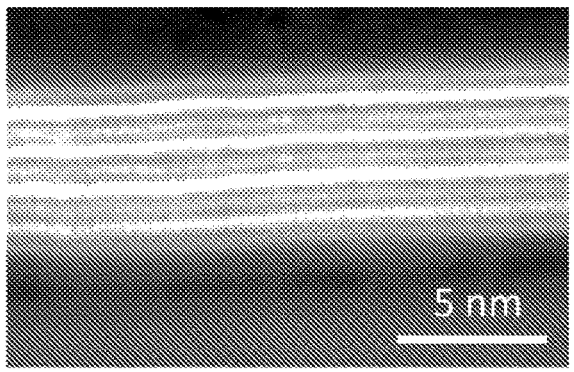
FIG. 7 illustrates spatial mapping of EELS corresponding to HAADF images.
Figure 7:
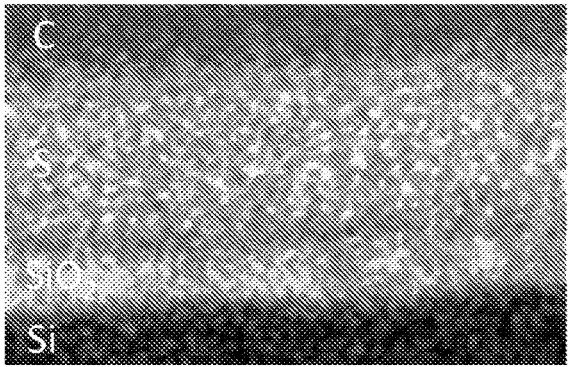
Figure 7:
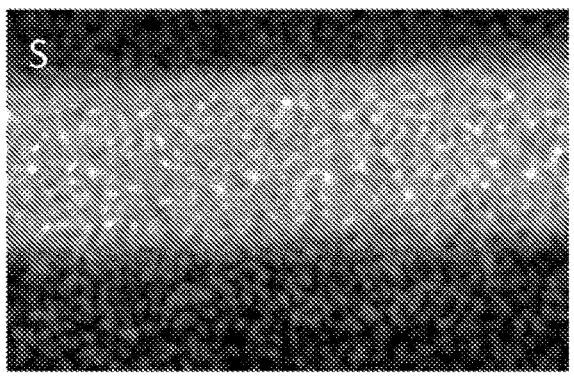
Figure 7:
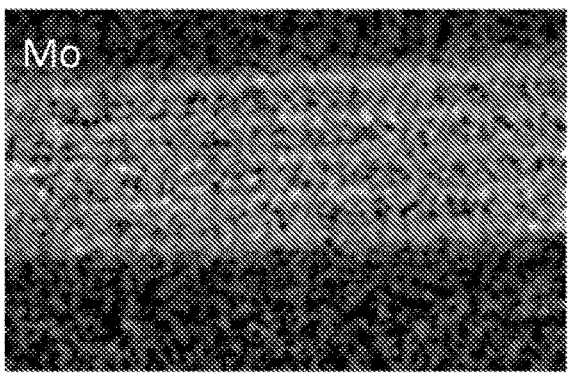
Figure 7:
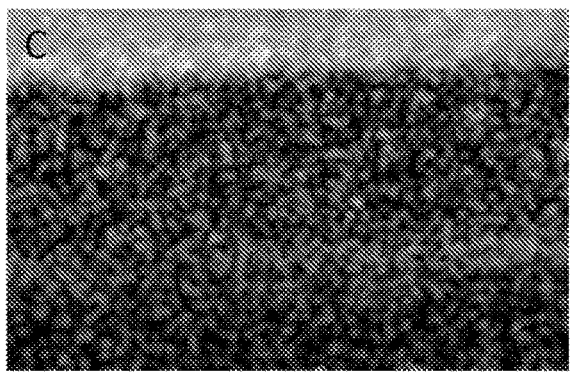
Figure 7:
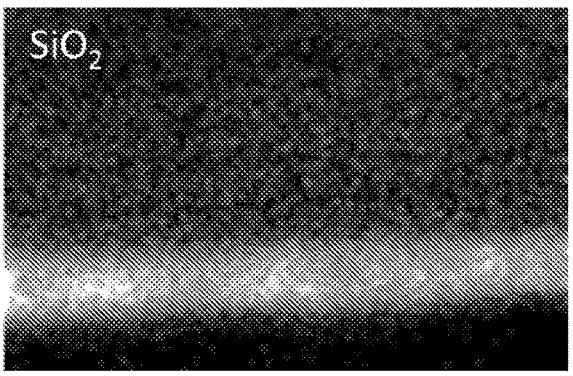
Figure 8:
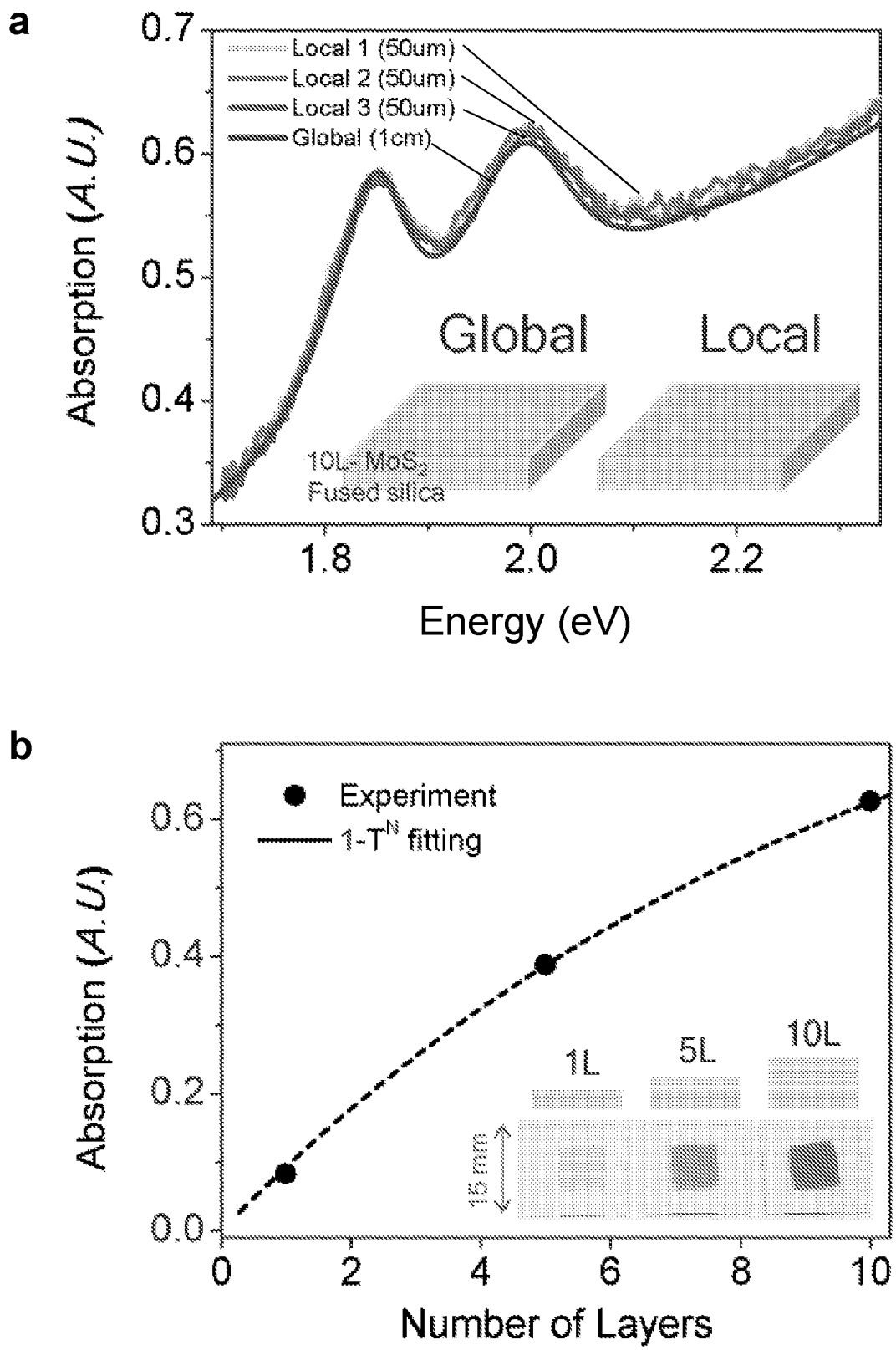
FIG. 8 illustrates optical absorption of $MoS_2$ films. a, spectra collected for N=10 with local measurement (diameter ~50 μm) at different locations and global measurement for the whole sample (~1 cm). All spectra are similar, showing the optical uniformity of the film. Inset: schematics of the sample and the measurement. b, absorption at 532 nm as a function of N collected globally. Our result follows the trend 1-TN with T=0.91. This roughly shows the N-control optically, in complement to the electrical data in FIG. 3. Inset: schematics and photos of the measured sample.
Figure 9:
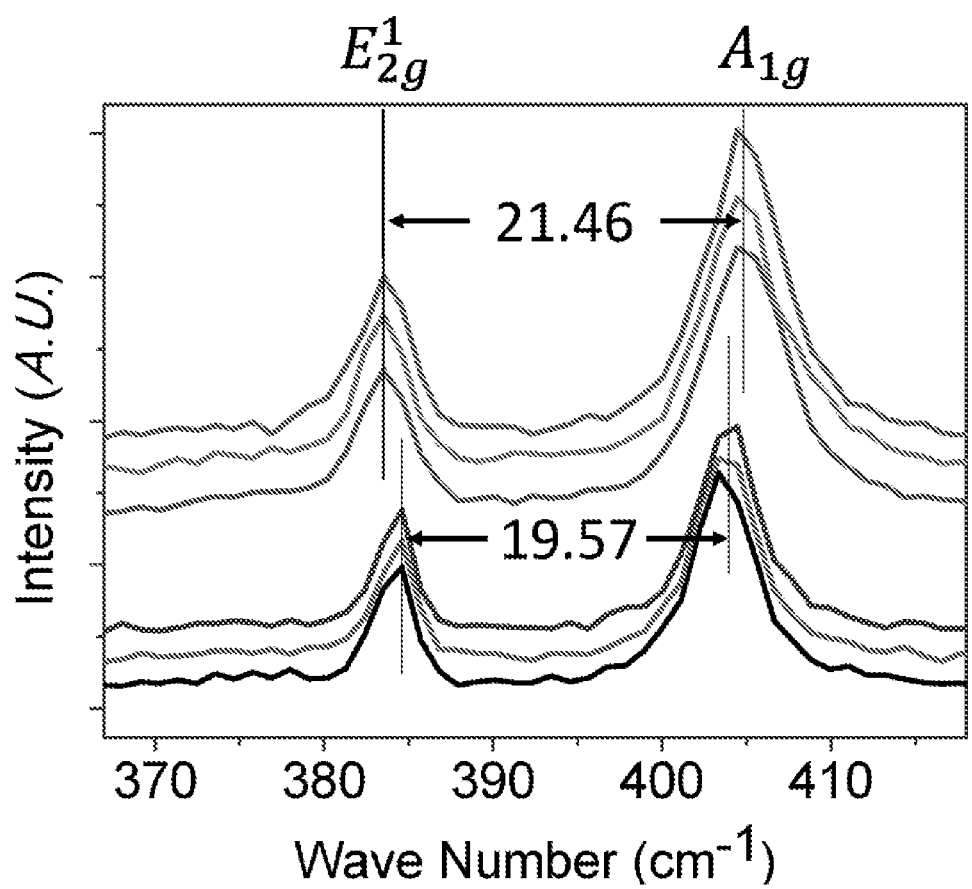
FIG. 9 illustrates Raman spectra of $MoS_2$ films for N=1 and 2. The two peaks are the in-plane $E_{12g}$ and out-of-plane $A_{1g}$ mode. The peak separation is related to the mechanical coupling in the materials. The ~21.5 cm-1 peak separation in N=2 indicates we have twist angles between layers (typical number: monolayer ~19; twisted bilayer ~22; aligned (0 or 60) ~23 cm-1 (8, 9).)

FIG. 1 presents our representative VDW film with programmable compositions and ultraclean interface. The TEM samples are prepared by ion milling and focused ion beam (FIB) from randomly selected regions on a large scale VDW film. FIG. 1(a) shows a cross sectional annular dark field TEM image of our VDW film, where the contrast of $MoS_2$ layers (dark) and $WS_2$ layers (bright) are clearly distinguishable due to the atomic number difference (also see in the contrast profile in FIG. 1(b)). There are three main observations from FIG. 1(a). First, the VDW film forms a superlattice, monolayer $MoS_2$/monolayer $WS_2$ alternative structure as we designed (schematics in FIG. 1(a)), and it shows monolayer scale controllability of composition and thickness. Second, the individual layers all appear as uniform, continuous, and straight monolayer, and are parallel to each other. Third, the interlayers maintain extremely clean and bubble/wrinkle free with constant interlayer distance ~0.638 nm, which is expected value for $MoS_2$/$WS_2$ stacking with random crystal orientation. The corresponding elemental analysis along the stacking direction from EELS are shown in FIG. 1(b) and FIG. 7. The molybdenum concentration (green) exactly matches the location of $MoS_2$ layer in FIG. 1(a), while sulfur (yellow) is uniform everywhere for both $MoS_2$ and $WS_2$. Carbon (red), on the other hand, is not detectable under our instrument resolution inside the stack, which also supports the cleanness of the interface. The above analysis confirms that our stacking process provide the composition controllability at monolayer scale in programmable manner, and excellent interface quality without unwanted defects.

Figure 6:
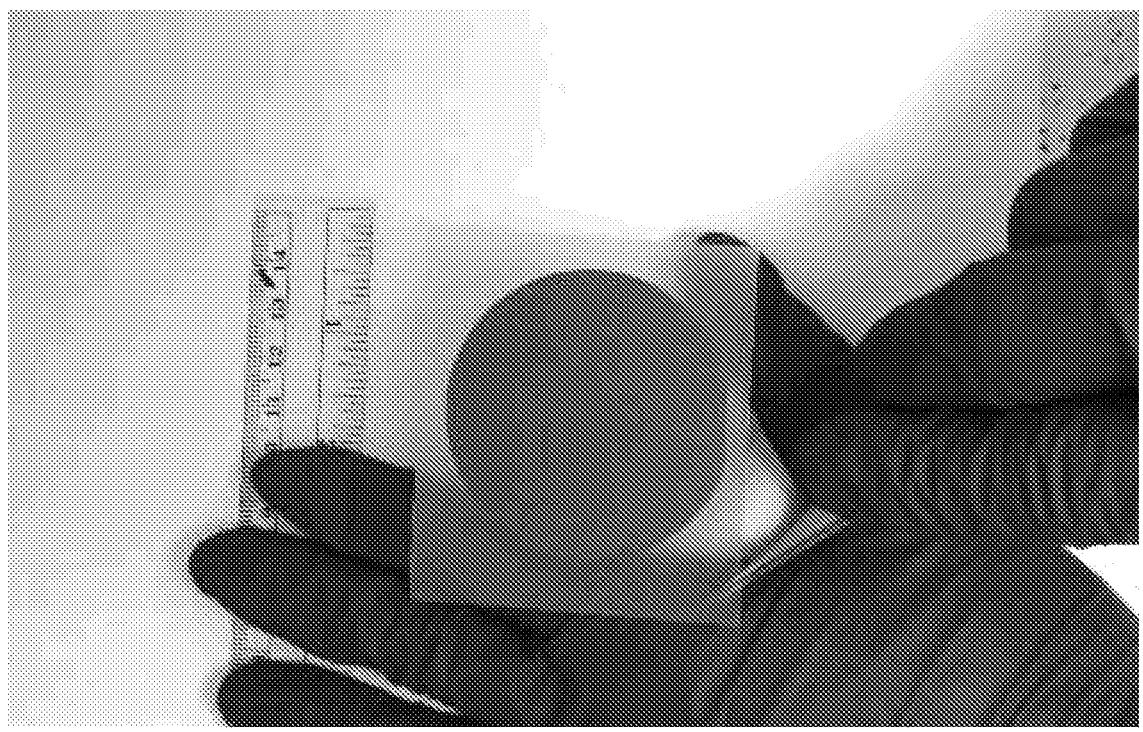
FIG. 6 shows the peeling process for 2-inch wafer scale $MoS_2$ monolayer film.

FIG. 2(a) illustrates our VS process for generating high quality, programmable VDW films as shown in FIG. 1. There are five steps for the process as below. I, a series of wafer scale TMD monolayers on $SiO_2$/Si substrate are prepared by MOCVD. II, the initial layer (L0) is separated from the growth substrate by dry peeling (FIG. 6) with pmma/thermal release tape (TRT). III, L0/TRT and the next TMD layer (L1) on substrate are put into a vacuum box and pressed into contact in vacuum. IV, L1/L0/TRT is peeled off from the substrate. The last two steps, III and IV, can be repeated until the desired number of layers (N) is reached. V, the N-layer TMD film is released from TRT to any target, in either supported or suspended form, for further characterizations and applications.

The process introduced above is specially designed to reach scalability, programmability and ultraclean interface of VDW films. First, the MOCVD is suitable for wafer scale growth of monolayer TMD building blocks since the gaseous MO precursor can be precisely controlled uniformly over entire substrates (10). In addition, it can be applied to general TMD materials by combination of metal and chalcogenide precursors. Second, the extremely low interaction of monolayer TMDs with the growth surface allows the repeatable stack-and-peel step as long as adjacent TMD-TMD interaction is stronger than TMD-growth substrates, which is governed by stacking condition. This enables us to achieve programmable VDW films with arbitrary composition and desired N. Third, the mechanical peeling guarantees ultra-clean bottom surface without any chemicals such as etchant or solvent. This together with the following stacking of individual monolayer in the vacuum significantly improves the interface quality by avoiding air exposure that could introduce amorphous carbon and air bubble when the stamp layers contact as-grown target samples and generate the interfaces.

FIG. 2(b-d) are the demonstrations of the above capability in the resulting VDW films. FIG. 2(b) displays photos of three layer $MoS_2$ stacked in wafer scale on TRT during the process. The inset photo shows the initial layer L0 from a 2" wafer on the TRT after the first peeling. Two more $MoS_2$ layers L1, L2 from 1" square substrates are then stacked as in the main photo, where clear contrast between different N's can be observed. Further optical characterizations of our large scale VDW films depending on N are presented in FIGS. e 8 and 9.

FIG. 2(c) shows the surface roughness of the VDW films by atomic force microscopy (AFM) to manifest the effect of vacuum stacking. Images are taken at the bottom surface of 3-layer $MoS_2$ films when the stacking is conducted in vacuum (left) or in ambient (right). As shown, the right image has bubble-like features (RMS ~700 pm) on the surface that are also reported in previous work, while the left image appears to be smooth (RMS ~270 pm). Therefore, we conclude that vacuum-stacking improves the cleanness at the interface in our film, which helps build these VDW films with consistent quality.

The cross-sectional STEM image in FIG. 2(d) shows $MoSe_2$/$MoS_2$/$WS_2$ VDW films prepared by VS. Even though there is a lattice mismatch between $MoSe_2$ and $MoS_2$ (~4%), as well as an interlayer rotation between $MoS_2$ and $WS_2$, VDW films still forms without misfit dislocations. It presents our composition programmability can be applied to be universal TMD monolayers in any combination regardless their lattice difference and rotation angle.

Based on the process, we are now able to control, at monolayer level, the electrical properties of the VDW film in the out-of-plane direction with large scale in-plane uniformity. Specifically, we demonstrate such capability in two ways: controllability of N (FIG. 3), and programmability of composition (FIG. 4). For this purpose, we fabricate vertical metal-VDW film-metal devices (schematics, FIG. 3(a)) to measure the electrical transport in the out-of-plane direction, where the VDW film being sandwiched is controllably varied in the experiment. On the contrary, to exam the in-plane uniformity of our process, we fabricate the devices as an array by standard photolithography shown in FIG. 3(a). Here, the devices are designed with 5×5 µm$^2$ sandwiched area and distributed over ~5×5 mm$^2$ on fused silica for each N as the test platform for large-scale uniformity (detail in Method).

First, we demonstrate the electrical properties control depending on N. Tunnel devices are used as the test platform because the tunnel current is exponentially sensitive to the barrier shape such as width (determined by N) and height (determined by the composition). In FIG. 3(b), we carefully design the gold/N layer (NL-) MoS$_2$/gold sandwiched structure to form the tunnel band structure (see schematics) and measure their I-V curves with N=3, 5, 7. It is qualitatively observed that, first, all representative devices show the non-linear I-V characteristic of tunneling. Second, the current decreases exponentially by ~10$^2$ with each additional two layers. These two features together indicate that we have the tunneling across the MoS$_2$ barrier as described by the schematics, and, indeed, the N can be varied. Notice that the design of the band structure may be critical here: for example, the tunnel characteristic may disappear if Ti is used as the contact metal. The importance of such band alignment design will be further discussed in FIG. 4 as well as in Example 1.

Quantitatively, statistical analysis is shown in FIG. 3(c). Here, we plot the statistics of the zero-bias tunneling resistance (R$_0$A) of the devices to each N (detail in SI). Our experiment data show consistent increment by a factor of 10 for each additional layer from N=3 to 7. Moreover, this trend follows the theoretical tunneling model (dash line) (17) when the single fitting parameter, the barrier height $\phi_B$, is 0.5 eV. The agreement here shows that the MoS$_2$ indeed forms a good tunnel barrier, because otherwise the tunnel resistance can deviate exponentially if N is not controlled in the sandwiched area of the device. For large scale uniformity, as shown in the inset, the device array with N=7 over the ~5×5 mm$^2$ area shows very small uncertainty, which is less than 35% of the average, equivalent to a variation of only 0.15 layers. The results above indicate that we achieve the high controllability of N and the large-scale uniformity in our process.

Figure 10:
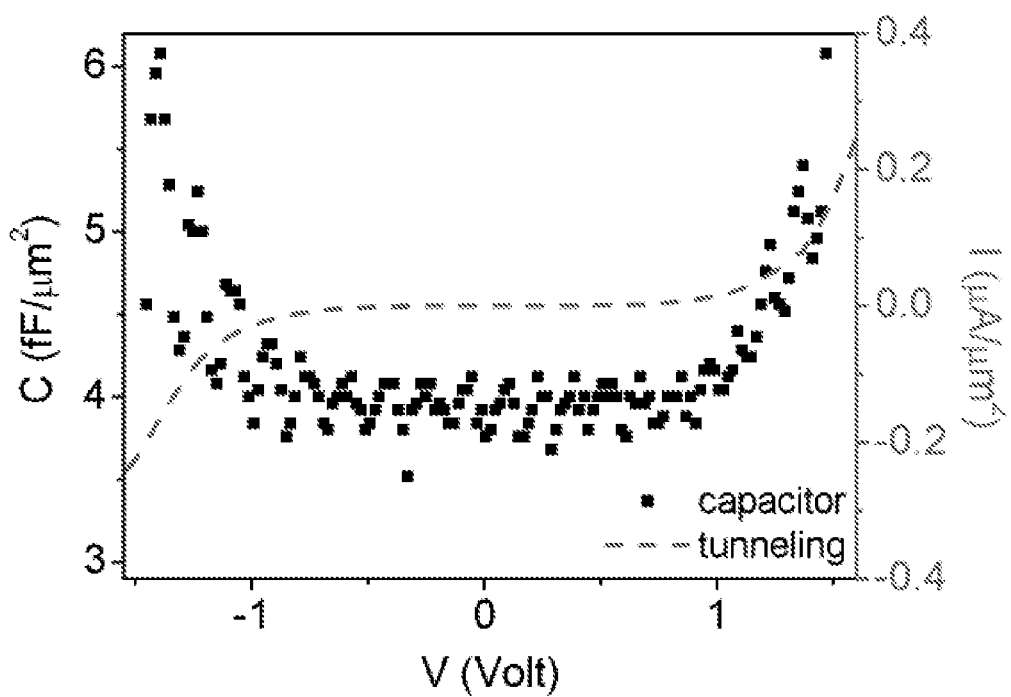
FIG. 10 shows characterizations of $MoS_2$ (9-layer) as a new dielectric material. a, C-V curve and leakage (tunnel) current. It is shown that the capacitance maintains a constant within the range of [-1V, 1V], corresponding to a vertical electric field of E ~0.17 V/nm. Outside this range, the leakage current will significantly affect the measurement. Notice that this E strongly varies with N because the tunnel current would decrease exponentially. b, I-V curves before and after the breakdown voltage around ~2V (, or, E ~0.34 V/nm). After the breakdown voltage, it shows linear I-V curve at all voltage. This is an irreversible process.
Figure 10:
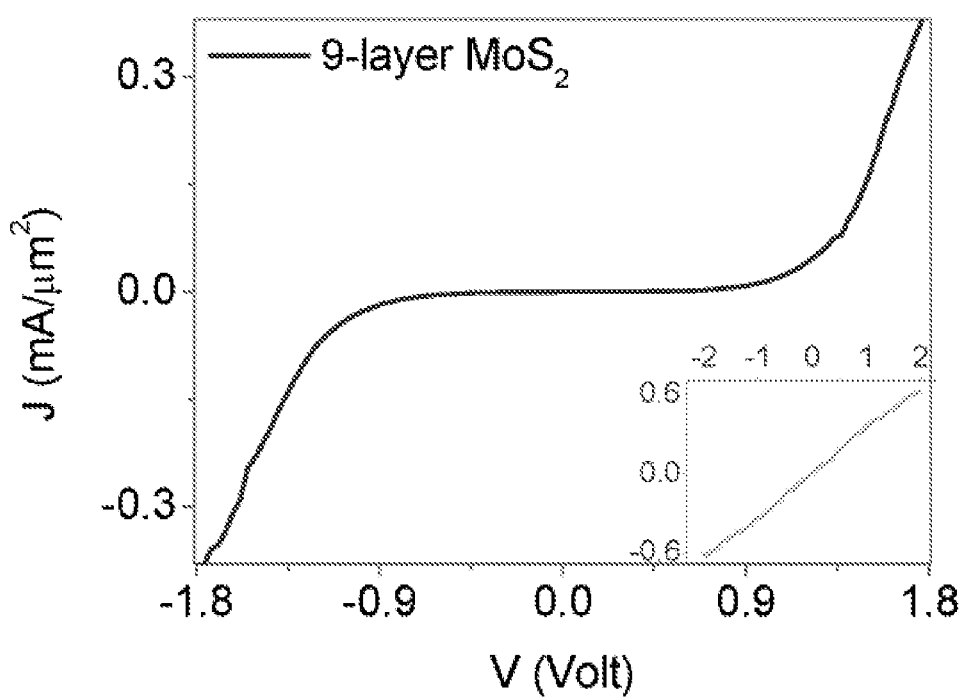

In FIG. 3(d), the control over N is further confirm up to N=11 with capacitance measurement, which provides another thickness-sensitive characterization. Similarly, the N-dependence of MoS$_2$ capacitors (empty diamonds) shows small variations and consistent trend that follows the parallel plate capacitor equation (dash line) when the single fitting parameter, the dielectric constant $\varepsilon_{MoS2}$, is 2.9. This value is also close to previous reported value for monolayer MoS$_2$ (detail in Example 1 and FIG. 10), showing our control over MoS$_2$ as a good dielectric with designed N's up to arbitrary number.

In parallel, we can also control the electrical properties via the programmability of composition, which allows us to design the band alignment. In FIG. 4, we show such capability using the same geometry in FIG. 3(a) but having three different VDW films with the same N: MoS$_2$, WS$_2$, and MoS$_2$/WS$_2$ (3-layer/3-layer, noted as Mo/W hereafter). FIG. 4(a) first shows their tunneling I-V curves at nearly zero-bias. When the MoS$_2$ is replaced by the WS$_2$, we are able to tune the zero-bias resistance up to ~10$^4$ times, from 1 MΩ·µm$^2$ to 10 GΩ·µm$^2$. This huge tuning can be theoretically explained by the higher band offset in WS$_2$, which therefore forms a higher barrier (see schematics). Meanwhile, Mo/W shows 100 MΩ·µm$^2$ that is well between the other two, indicating that we are also able to fine-tune the tunnel resistance with their mixture according to the band structure and tunnel model (see schematics and Example 1).

Figure 11:
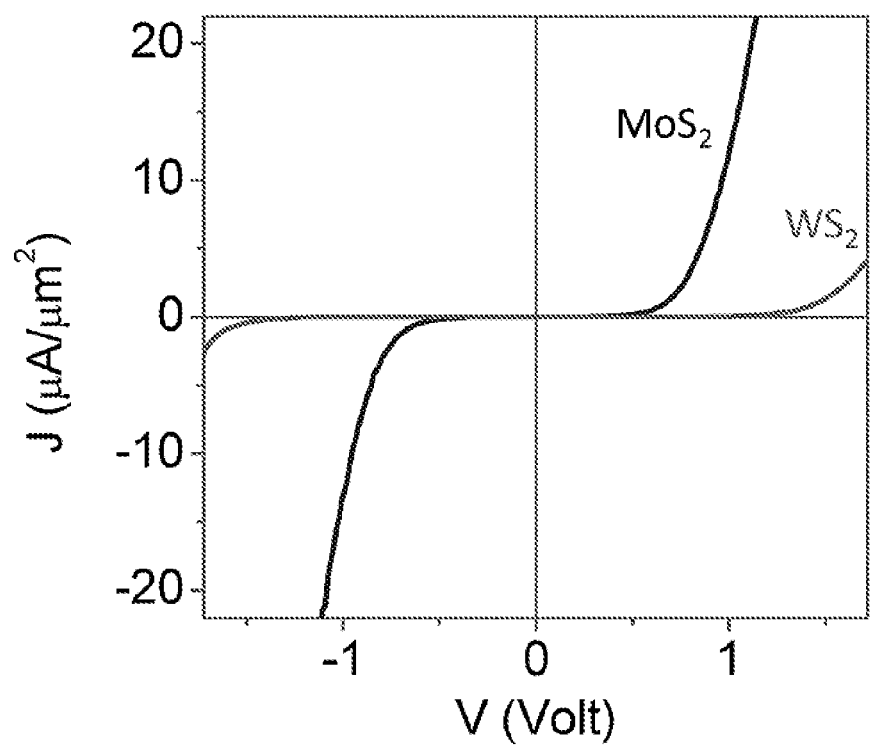
FIG. 11 illustrates I-V curves of 6L-$MoS_2$ and 6L-$WS_2$ at large voltage. For $MoS_2$, the I-V curve is symmetric at all range. For $WS_2$, it is generally symmetric, with little bias-dependence (|I(forward)/I(backward)|<2, in comparison to ~10 for Mo/W.) For $WS_2$, the asymmetry might be an artifact because we use the fabrication process optimized for $MoS_2$ to process $WS_2$. For Mo/W, therefore, we use $MoS_2$ as the top 3 layers, which should help to preserve the intrinsic behavior after device fabrication.

Besides tuning existing properties, Mo/W also forms the distinct asymmetric tunnel barrier that can lead to new properties. As shown in FIG. 4(b), at large bias the tunneling I-V curve shows large asymmetry, with forward bias (+V) current being 10 times higher than the reverse (-V) at V=1.4 Volt (WS$_2$ grounded as schematics shown). In comparison, MoS$_2$ and WS$_2$ both show symmetric curves in the same voltage range (see FIG. 11). We attribute this diode behavior to the metal-insulator-insulator-metal (MIIM) tunnel diode, since tunneling is the dominant transport in this ultra-thin film (~4 nm) device. The operation of MIIM is illustrated as the inset schematics: at forward bias (iii), the large voltage V on MoS$_2$ bends part of the conduction band below the fermi level, allowing electrons to tunnel from gold into MoS$_2$. In contrast, electrons still have to go through the full barrier at -V at reverse bias (i), due to the higher band offset in WS$_2$. The different effective barrier width at opposite bias therefore attributes to the asymmetric I-V curve. In FIG. 4, both demonstrations show properties as we designed based on theoretical band structure, which cannot be achieved if there is control failures such as unwanted doping or interlayer mixture of the elements in the VDW film. Accordingly, the control of the material properties here indicates that our process indeed provides excellent programmability of the compositions.

FIG. 1-4 confirms the layer-by-layer programmability of compositions and ultraclean interface between layers in our VDW films via VS process, which enable us to design artificial material with atomic control close to fundamental limits. Moreover, VS process also allow us to separate the programmable VDW films from the substrates as a freestanding membrane in large scale to take the advantage of its ultra-thinness.

In FIG. 5, we generate the freestanding VDW membrane and demonstrate its potential applications. As shown in FIG. 5a, the VDW film is transferred on a TEM chip with 1×1 mm$^2$ hole at the center (see schematics). Bottom photo shows an example of fully suspended 7-layer MoS$_2$ films over the hole with clear yellowish surface. Our suspended membrane is successfully demonstrated since the TMD monolayer can be completely separated from the substrate and stacked without holes, wrinkles and cracks. In addition, the film is only ~5 nm thick over 1 mm hole, giving one of the highest aspect ratio (length:thickness) of 2×10$^6$:1, which can provide a novel atomically thin material platform in technologically relevant scale toward future membrane mechanics, optics and electronics as well as the integration of them.

In FIGS. 5(b) and (c), we demonstrate applications of the VDW membrane that can be potentially integrated with others for practical uses. In FIG. 5(b), patterned gold on fused silica is imaged clearly through the MoS$_2$ membrane (schematics on top) by optical microscope under white light illumination. The high transparency, inherent from its ultra-thinness, makes it a promising platform for optical windows or transparent electronics. In FIG. 5(c), the scanning electron microscope (SEM) image shows the freestanding cantilever array patterned by FIB. FIB allows us to pattern arbitrary shape on atomically thin membrane, which would lead to new class of micro-electromechanical systems (MEMS).

In conclusion, the VS process presented here illustrates a new method for precise material programming down to atomic level with ultraclean interface. Its simple process works up to wafer scale and allows final VDW films in either form of on-substrate or substrate-free. Our method is expected to be universal to any layered materials or even patterned atomically thin circuitry, as long as the materials can be separated from substrates with a clean method. The new capability brought in by VS process may, in principle, accelerate the use of layered materials for novel physical systems and state-of-the-art technology, which is potentially beneficial to both academia and industry.

Growth of TMD films. Wafer scale monolayer films of $MoS_2$, $WS_2$, $MoSe_2$, $WSe_2$ were grown by metal organic chemical vapor deposition (MOCVD) (1). Molybdenum hexacarbonyl (MHC), tungsten hexacarbonyl (THC), diethyl sulphide (DES), and dimethyl selenide (DMSe) are selected as chemical precursors for Mo, W, S, and Se respectively, and introduced to the furnace in gas phase. $H_2$ and Ar are injected to the chamber using separate lines. The optimum growth parameters for ML TMD films are as follows. We use a total pressure of ~10 Torr, growth temperature of 550° C. and growth time of 26 hrs. The flow rate of precursors are 0.01 sccm for MHC or THC, 0.4 sccm for DES, or DMSe, 5 sccm for $H_2$, and 150 sccm for Ar, which were regulated by individual mass flow controllers (MFCs). NaCl is loaded in the upstream region of the furnace, which significantly increases the grain size.

Stacking. (1) Fabrication of Initial Layer L0

L0 is used as the stamp layer and the process is as follow: Spin coating of PMMA (Poly-methyl methacrylate, 495K, 4% diluted in anisole) for 90 second at 4000 rpm on as-grown monolayer TMD films (MLTMD) sitting on $SiO_2$/Si. Baking 10 min at 180° C. using hot plate, followed by attaching thermal release tape (TRT) manufactured by Nitto on PMMA/MLTMD/$SiO_2$/Si. TRT/PMMA/MLTMD(L0) is separated from the substrate via mechanically peeling, which granted it the ultraclean bottom surface. PMMA can be replaced by any thin film that can be conformally deposited on the TMD surface, such ALD $SiO_2$, $HfO_2$, CVD Si, and thermal evaporated Au. This process can be generally applied to MOCVD grown monolayer TMD film, such as $MoS_2$, $WS_2$, $MoSe_2$, and $WSe_2$.

(2) Stacking in the Vacuum Box

Figure 12:
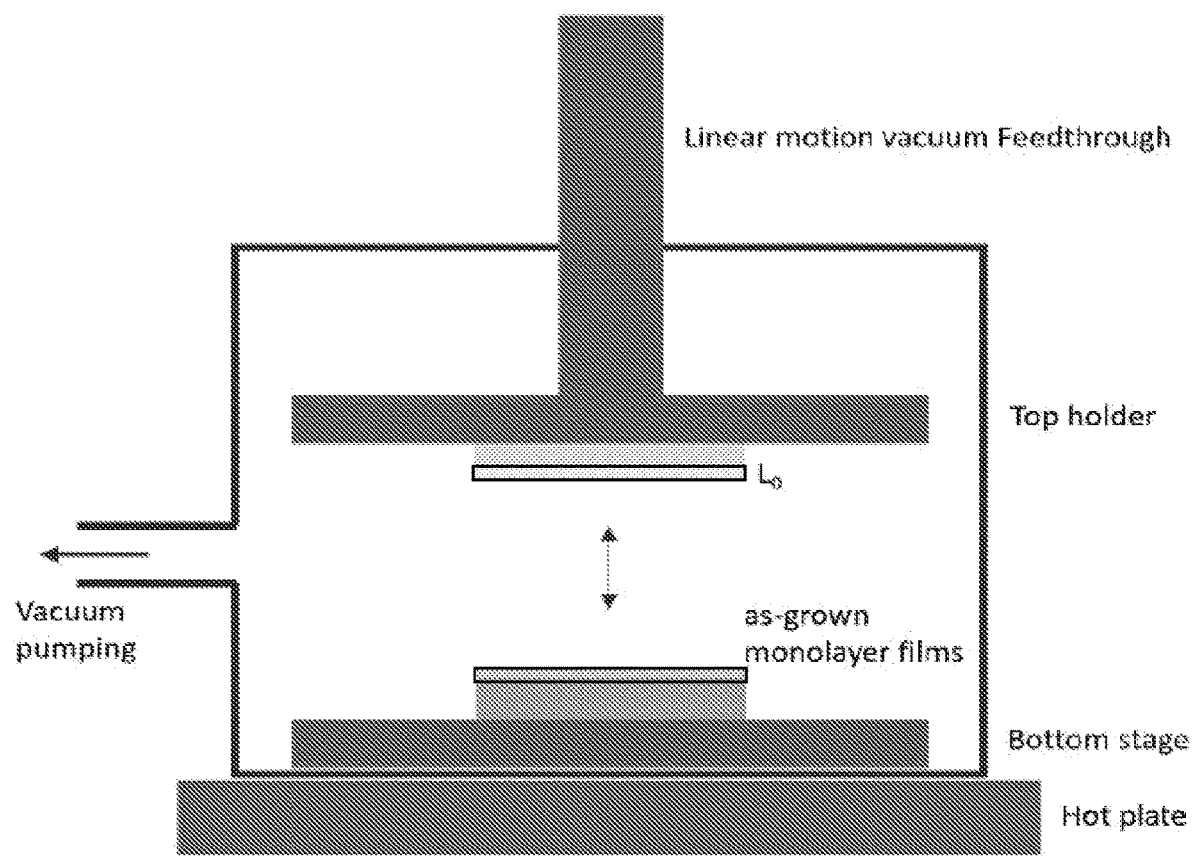
FIG. 12 shows schematics of a vacuum stacking tool.

As shown in FIG. 12, we use a specially designed vacuum stacking tool including vacuum sealed box, vacuum pump, linear motion vacuum feedthrough, and heating unit underneath of the vacuum box. Stacking process is as follow: Mount TRT/PMMA/L0 at top holder, and put another as grown monolayer films on the bottom stage of vacuum box. Lower the top holder to make contact between L0 and as-grown monolayer L1 on $SiO_2$/Si on the bottom stage using z-motion linear vacuum feedthrough. Stay for 10 mins Lift the top holder with stacked sample. After the stacking process, L0/$SiO_2$/Si is readily attached to TRT/PMMA/L0. The stacking process operates when the chamber is evacuating to less than 200 mTorr, and heating at 150° C.

(3) Re-Peeling and Re-Stacking

To improve separation yield, following steps are carried out before starting next round of 'peel' and 'stack' process: 1) release the used TRT from PMMA/L0/L1/$SiO_2$/Si by heating at 110° C., ambient condition. 2) do additional annealing at 180° C. for 10 min after removing TRT. 3) attach new TRT on PMMA/L0/L1/$SiO_2$/Si. After replacing the TRT, the bottom of the sample (i.e., Si,) is attached on a glass slide using double side tape. The stacked film (TRT/PMMA/L0/L1) is separated from the substrate using mechanical peeling again. The repeatable process of 'stack' and 'peel' allows us to generate L2, L3, LN.

(4) Transfer and Releasing (i) Supportive Form

LN is transferred on any target substrates using vacuum stacking process. Then TRT is removed by heating at 110° C. at ambient condition. PMMA on multi-stack VDW films can be removed by either way of high vacuum (<$10^{-6}$ Torr) annealing at 325° C., or soaking to acetone after an additional annealing at 180° C. in ambient for 30 mins and cooling down.

(ii) Suspended Form

Figure 13:
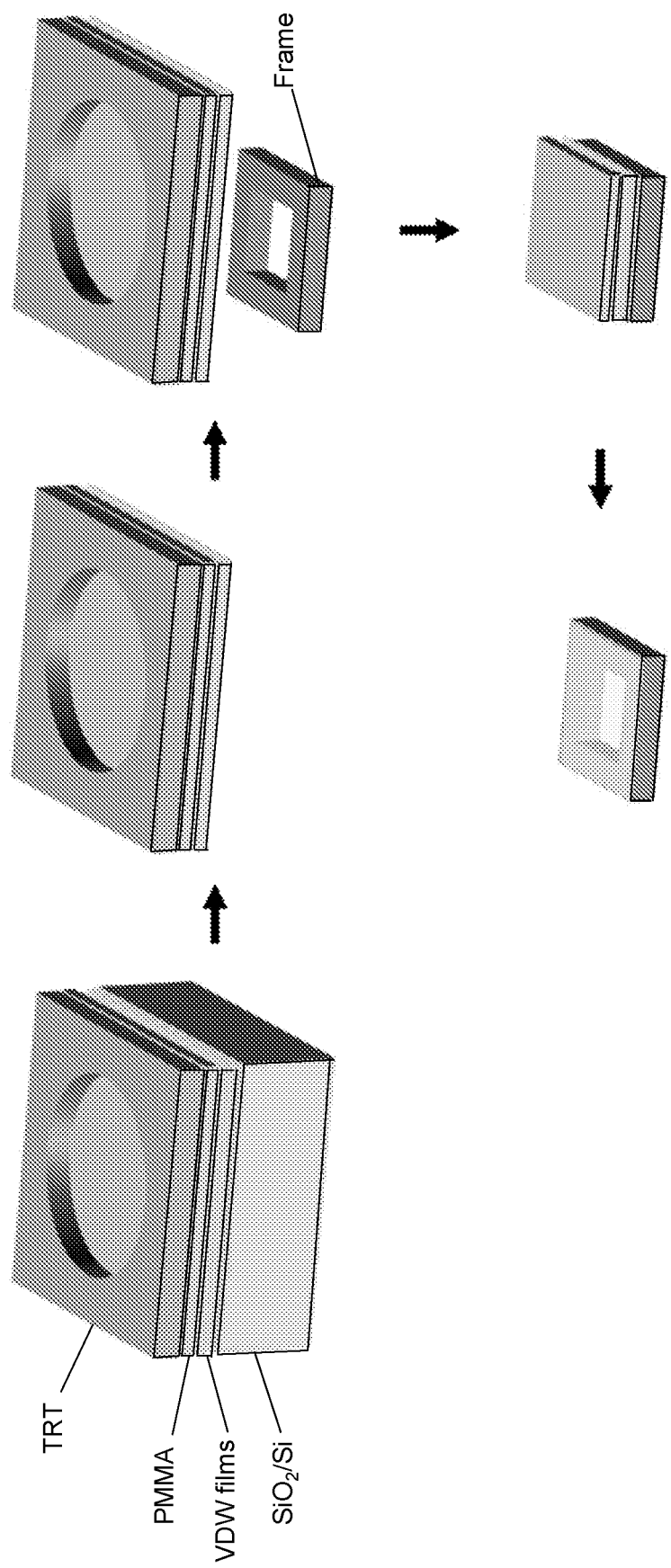
FIG. 13 shows schematics of transferring process for suspended form.

As shown in FIG. 13, suspended PMMA/VDW films are generated by using TRT with a punched hole inside. After separation of PMMA/VDW films from the substrate by mechanical peeling, the suspended PMMA/VDW films can be transferred onto the target frame with gradual heating from room temperature to 180° C. to allow the PMMA on VDW films to melt and conformally cover the frame. The remaining PMMA outside of the frame is cut by knife. The PMMA is removed by high vacuum (<$10^{-6}$ Torr) annealing at 325° C.

TEM analysis. STEM specimen preparation and imaging: A cross section of the specimen was prepared by using a standard lift-out procedure in a dual-beam FEI Strata 400 focus ion beam system with a final milling at 2 keV. Afterwards, the specimen was baked in an ultrahigh vacuum chamber at 130° C. for 8 hours to clean the specimen. After baking, the specimen was transferred to a Nion Ultra-STEM 100 operated at 60 keV. The imaging condition was similar to that in (2). For HAADF-STEM images, the beam convergence angle was ~35 mrad, with a probe current of ~70 pA. The acquisition time was 8 μs per frame and we sum 10 frames. The EELS spectrum and maps were acquired with an energy dispersion of 0.25 eV/channel using a Gata Quefina dual-EELS Spectrometer. A linear combination of power laws (LCPL) was used to fit and subtract the background. The EELS false-color composition maps were created by integrating the S-L2,3 edge, C-K edge, Mo-M4,5 edge and Si-L2,3 edge. All EELS analysis was done with open-source Cornell Spectrum Imager software (3).

Optical measurements. VDW films of different N are transferred to fused silica substrate for the optical absorption measurement. Photoluminescence and Raman spectroscopy are done with $SiO_2$/Si substrate.

Optical absorption: Measurements are done in transmission mode with DUV-Vis-NIR hyper-spectral microscope described in (6) and Shimadzu UV-Vis-NIR Spectrometer for local and global measurement, respectively. Spot size for the hyperspectral microscope is ~50 μm in diameter while it is ~1 cm for Shimadzu Spectrometer. We measure the transmitted light intensity at the two regions, VDW films on substrate (Iv) and bare substrate (Is), and calculate the fractional change in the transmittance ($\delta_T$) as (Iv−Is)/Is. $\delta_T$ is approximately linked to the absorption (A) by $\delta_T=(2/n_s+1)\times A$, where $n_s$ is the refractive index of fused silica here.

Photoluminescence: The photoluminescence (PL) measurements are performed with a 532 nm excitation laser under ambient conditions. The PL spectra from the sample are collected by an imaging spectrometer with a CCD camera, and the PL images were taken directly using bandpass filters with the center wavelength corresponding to 1.9 eV for $MoS_2$.

Raman spectroscopy: Measurements are performed with green laser (532 nm) in InVia Confocal Raman microscope (Renishaw) at room temperature. Spatial resolution ~1 μm.

Device fabrication. Devices geometry is as shown in FIG. 3(a). For the fabrication, we start with e-beam evaporation of 5 nm Ti/40 nm Au on fused silica chips (1.5×1.5 mm²). The bottom electrodes are defined by standard photolithography (PL) method, followed by gold solution etching. In order to have good VDW film transfer, the bottom electrode has to be very clean. Therefore, after dissolving the photoresist (PR) in Microposit Remover 1165, we treat the substrate with $O_2$ plasma at 400 W for 3 minutes in Glen 1000 to make sure there is minimum residue. The VDW film (typically ~5×5 min²) with programmed N and composition is then transferred to the bottom electrode as described in FIG. 2(a) and above, and the pmma supporter is removed in acetone. It is observed that even after pmma is removed, the initial layer is more n-doped than as-grown. Therefore, we adopt the previously reported superacid treatment (S2) on the VDW film to eliminate the doping from pmma at this point. Afterwards, top electrodes are fabricated by e-beam evaporation of 40 nm Au, patterned by PL and gold solution etching, and remove of PR. Bottom gold electrodes covered by VDW films are intact after the solution etching owing to the good peeling yield and its inert chemical reactivity. In the next step, we also etch away the part outside of the crossing area by PL for patterning and $SF_6/O_2$ plasma in Oxford Plasmalab 80+ for etching. In the final step, superacid treatment is performed again to make sure the effect maintains after all the process.

Electrical measurements. All the electrical measurement are done in ambient condition at room temperature with Karl Suss PSM6 Probe Station using W probe tip (SE-20TB, Signatone). For I-V characterization, the probe station is coupled to high precision source measurement units (SMUs) (Keithley, 236 SOURCE MEASUREMENT UNITS), voltage source (Keithley, 213 QUAD VOLTAGE SOURCE) and trigger (Keithley, 2361 TRIGGER CONTROLLER). The I-V measurement on tunnel devices (FIG. 3(b)(c) and FIG. 4) is performed in four probe geometry for AT6 and two probe for N≥16 to minimize error from contact resistance and instrument impedance, respectively. No significant difference between the two geometry is observed for N=6. For capacitance measurement, the probe station is coupled to Keithley C-V syetem (Keithley, 590 CV ANALYZER/230 PROGRAMMABLE VOLTAGE SOURCE/5951 REMOTE INPUT COUPLER). All measurements are done in two probe geometry, and the parasitic capacitance of the instrument is measured and subtracted from the capacitance results.

Tunnel equation for zero-bias resistance. The zero-bias resistance ($R_0A$, in $\Omega \cdot \mu m^2$,) from experiment is extracted by linear fitting to each I-V curve at very small bias (between ±0.01 V). Theoretically, $R_0A$ is described as the following equation.

$$R_0 \cdot A = \frac{h^2 N t_{MoS_2}}{e^2 \sqrt{2m\phi_B}} \exp\left(\frac{4\pi\sqrt{2m\phi_B} N t_{MoS_2}}{h}\right)$$

for V<<φB, where h is the planck constant, e and m electron charge and effective mass, t the thickness and $\phi_B$ is the average barrier height of the barrier (thus also applicable to FIG. 4(a)). This equation shows that $R_0A$ is independent of the applied bias V, and is only dependent on barrier parameters such as the barrier width and height. Therefore, it serves as a good number for comparison.

In FIG. 3(c), the dash line comes from the above equation with set parameters of $MoS_2$(t=0.65 nm, m=0.35 m0 (m0 the electron's free mass)) and one fitting parameter $r\phi_B$. When $\phi_B$=0.5 eV, the equation shows the best fit. Note that we do the fitting by first converting into log scale for calculation and then convert it back to linear scale for plotting to avoid over-weighting of the higher resistance data points. Other values such as the average and uncertainty are all calculated in the same way for the same reason.

$MoS_2$ dielectric constant and its application as new dielectric material. In FIG. 3(d), all devices (N=7 to N=11) can be fitted by a single dielectric constant $\varepsilon_{MoS2}$=2.9. Although this number is close to reported value for monolayer $MoS_2$, $\varepsilon_{MoS2}$ increases as a function of N. However, this N-dependence is not observed in our devices. One significant difference in our $MoS_2$ film is the random twist angles between the layers, as pointed out in FIG. 2(d) and the Raman spectrum below, while previous dielectric studies are all conducted on TMD with aligned crystal axes (i.e., 0° or 60°). The distinct crystal structures can likely result in the different dependence of dielectric constant here. However, support is needed for the hypothesis.

Our capacitance experiment here also indicated that TMDs can serve as good dielectric materials. There are several advantages of TMDs in comparison to common dielectrics such as oxide and hexagonal boron nitride (hBN). For oxide dielectrics, they generally degrade the performance of 2D materials. For example, the mobility of graphene is reported to be degraded on silicon oxide due to the ubiquitous dangling bonds on the surface as charge scattering centers. In contrast, 10 times better mobility is observed with hBN as the substrate since its surface has dramatically less dangling bonds. However, for hBN it cannot be produced with thickness homogeneity up to wafer scale so far, limiting the application of hBN to small scale devices. On the contrary, TMDs also has a dangling bond-free surface similar to hBN.

Moreover, based on our method, we can produce TMD dielectric with controlled thickness and wafer-scale uniformity, making it more promising for practical applications. The basic characterizations (C-V curve, leakage current and breakdown voltage) are presented below in FIG. 10.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of forming a VDW film comprising one or more TMD monolayers, and having a heterostructure comprised of at least two atomically thin monolayer TMD building blocks, wherein the VDW film has no detectible carbon and less than one bubble defect and/or wrinkle defect per 2 micron×2 micron area, wherein an interlayer between two adjacent TMD monolayers is a clean, bubble-free and wrinkle-free interface comprising a constant distance, the method comprising:
   providing a formation substrate having one or more transition metal dichalcogenide (TMD) monolayers disposed on the formation substrate;
   dry peeling at least one of the TMD monolayer from the formation substrate;

transferring the TMD monolayer to a substrate under vacuum to form a Van der Waals (VDW) film;

optionally, repeating the providing, dry peeling, and transferring to form a VDW film comprising a plurality of TMD monolayers on the substrate.

2. The method of claim 1, further comprising growing the TMD monolayers using metal-organic chemical vapor deposition (MOCVD).

3. A Van der Waals (VDW) film comprising one or more transition metal dichalcogenide (TMD) monolayers, and having a heterostructure comprised of at least two atomically thin monolayer TMD building blocks, wherein the VDW film has no detectible carbon and less than one bubble defect and/or wrinkle defect per 2 micron×2 micron area, wherein an interlayer between two adjacent TMD monolayers is a clean, bubble-free and wrinkle-free interface comprising a constant distance.

4. The VDW film of claim 3, wherein the film comprises a heterostructure comprising two or more different TMD monolayers and the heterostructure comprises stacked layers of AB, AC, ABC, ABCDBCDA, or any combination thereof, wherein A, B, C and D are TMD layers or TMD monolayers having different compositions.

5. The VDW film of claim 3, wherein the VDW film comprises one or more TMD monolayers selected from $MoS_2$ monolayers, $WS_2$ monolayers, $MoSe_2$ monolayers, $WSe_2$ monolayers, $MoTe_2$ monolayers, $WTe_2$ monolayers, $NbSe_2$ monolayers, and combinations thereof.

6. The VDW film of claim 3, wherein the film comprises a heterostructure comprising at least three atomically thin monolayer TMD building blocks made from at least three different TMD materials.

7. The VDW film of claim 3, wherein an interlayer between two adjacent TMD monolayers is a clean, bubble-free and wrinkle-free interface comprising a constant distance.

8. The VDW film of claim 3, wherein the VDW film comprises three or more TMD layers, six or more TMD layers, or nine or more TMD layers.

9. The VDW film of claim 3, wherein the thickness of each of the one or more TMD monolayers is controllable at sub-nm scale.

10. The VDW film of claim 3, wherein the VDW film comprises at least two TMD layers having different composition.

11. The VDW film of claim 3, wherein the film is disposed on a substrate.

12. An atomically-thin circuit comprising at least a portion of a VDW film of claim 3.

13. The VDW film of claim 3, comprising a heterostructure comprising at least two atomically thin monolayer TMD building blocks made from at least two different TMD materials.

14. The VDW film of claim 13, wherein the at least two different TMD materials are independently selected from $MoS_2$, $WS_2$, $NbS_2$, $MoSe_2$, $WSe_2$, $MoTe_2$, $WTe_2$, and $NbSe_2$.

15. An apparatus comprising one or VDW film of claim 3.

16. The apparatus of claim 15, wherein the apparatus further comprises one or more non-TMD layers, wherein an individual non-TMD layer is not in contact with another non-TMD layer.

17. A device comprising a VDW film of claim 3.

18. The device of claim 17, wherein the device is a tunnel device, a transparent electronic device, an optical device, a micro-electromechanical systems device, a mechanical device, a photovoltaic device, an optomechanical device, or an optoelectrical device.

19. The device of claim 17, wherein the device is a Josephson junction (JJ) array, a high current H-shape selector array, or quantum optical resonator.

20. The device of claim 17, wherein the device is a capacitor, a diode, a membrane, or an optical window.

* * * * *